(12) United States Patent
Ahmed et al.

(10) Patent No.: US 11,637,093 B2
(45) Date of Patent: Apr. 25, 2023

(54) MICRO LIGHT-EMITTING DIODE DISPLAY FABRICATION AND ASSEMBLY

(71) Applicant: Intel Corporation, Santa Clara, CA (US)

(72) Inventors: Khaled Ahmed, Anaheim, CA (US); Anup Pancholi, Hillsboro, OR (US); Sansaptak Dasgupta, Hillsboro, OR (US); Chad Mair, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 991 days.

(21) Appl. No.: 15/988,656

(22) Filed: May 24, 2018

(65) Prior Publication Data
US 2019/0363069 A1    Nov. 28, 2019

(51) Int. Cl.
| | |
|---|---|
| *H01L 25/075* | (2006.01) |
| *H01L 33/24* | (2010.01) |
| *H01L 33/32* | (2010.01) |
| *H01L 33/00* | (2010.01) |
| *G09G 3/32* | (2016.01) |

(52) U.S. Cl.
CPC ........ *H01L 25/0753* (2013.01); *H01L 33/007* (2013.01); *H01L 33/24* (2013.01); *H01L 33/32* (2013.01); *G09G 3/32* (2013.01)

(58) Field of Classification Search
CPC ............. H01L 25/0753; H01L 27/0156; H01L 21/6835; H01L 2221/68322
See application file for complete search history.

(56) References Cited

U.S. PATENT DOCUMENTS

| | | | |
|---|---|---|---|
| 2011/0315988 A1* | 12/2011 | Yu | ............ H01L 31/02161 257/458 |
| 2017/0133356 A1 | 5/2017 | Mercier | |
| 2017/0323925 A1 | 11/2017 | Schneider, Jr. et al. | |
| 2017/0338199 A1 | 11/2017 | Zou et al. | |

(Continued)

FOREIGN PATENT DOCUMENTS

| | | |
|---|---|---|
| WO | WO 2017-111801 | 6/2017 |
| WO | WO 2017-111827 | 6/2017 |

OTHER PUBLICATIONS

International Search Report and Written Opinion for International Patent Application No. PCT/US2019/027770, dated Aug. 8, 2019, 14 pgs.

(Continued)

*Primary Examiner* — John A Bodnar
(74) *Attorney, Agent, or Firm* — Schwabe, Williamson & Wyatt, P.C.

(57) ABSTRACT

Micro light-emitting diode (LED) displays, and fabrication and assembly of micro LED displays, are described. In an example, a pixel element for a micro-light emitting diode (LED) display panel includes a blue color nanowire or nanopyramid LED above a first nucleation layer above a substrate, the blue color nanowire or nanopyramid LED including a first GaN core. A green color nanowire or nanopyramid LED is above a second nucleation layer above the substrate, the green color nanowire or nanopyramid LED including a second GaN core. A red color nanowire or nanopyramid LED is above a third nucleation layer above the substrate, the red color nanowire or nanopyramid LED including a GaInP core.

15 Claims, 20 Drawing Sheets

(56) References Cited

U.S. PATENT DOCUMENTS

2017/0358623 A1* 12/2017 Thothadri .............. H01L 33/60
2018/0114878 A1    4/2018 Danesh
2018/0261582 A1*  9/2018 Henry .................... H01L 33/62
2021/0134641 A1*  5/2021 Fiorenza ............ H01L 21/6835

OTHER PUBLICATIONS

International Preliminary Report on Patentability for International Patent Application No. PCT/US2019/027770, dated Dec. 3, 2020, 11 pages.
Office Action from European Patent Application No. 19807648.1, dated Feb. 18, 2022, 9 pgs.

* cited by examiner

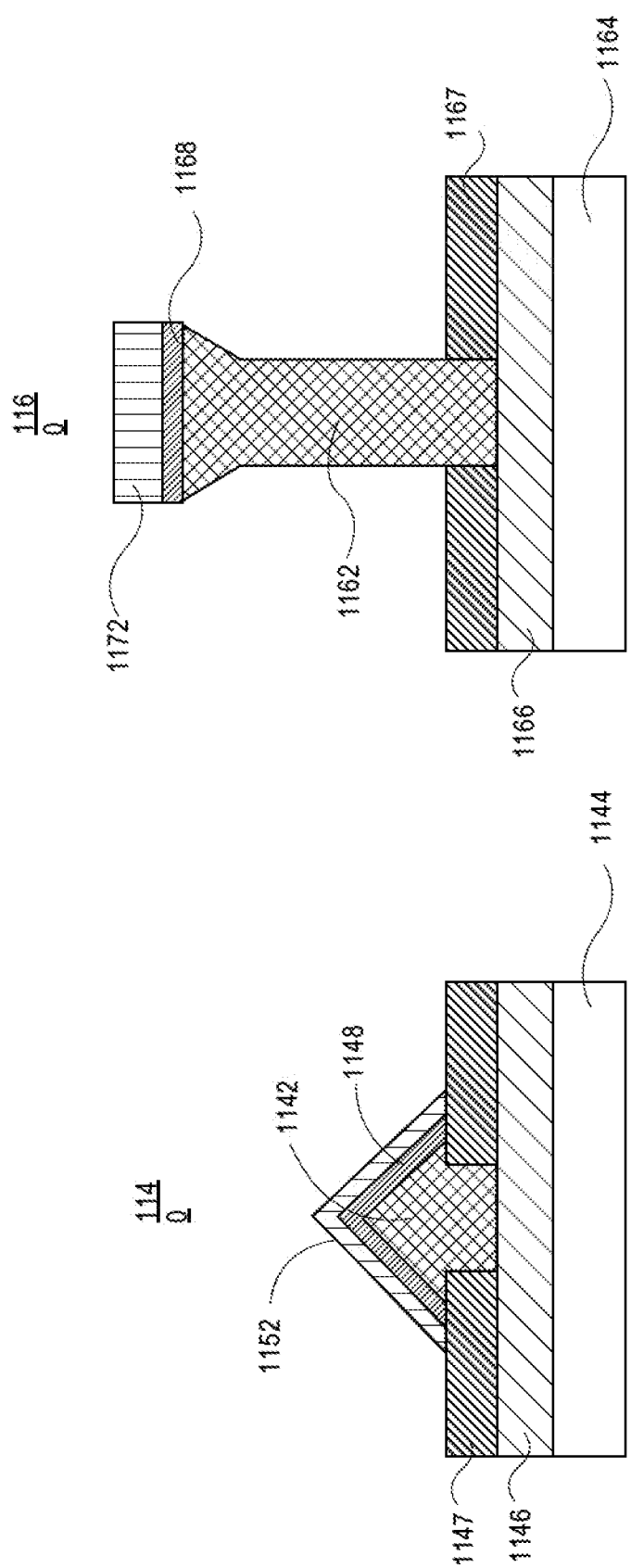

MICRO LIGHT-EMITTING DIODE DISPLAY FABRICATION AND ASSEMBLY

TECHNICAL FIELD

Embodiments of the disclosure are in the field of micro-LED displays and, in particular, micro light-emitting diode display fabrication and assembly.

BACKGROUND

Displays having micro-scale light-emitting diodes (LEDs) are known as micro-LED, mLED, and µLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 11C illustrates a cross-sectional view of a nanopyramid or micropyramid based LED highlighting certain layers of the LED, in accordance with an embodiment of the present disclosure.

FIG. 11D illustrates a cross-sectional view of an axial nanowire based LED highlighting certain layers of the LED, in accordance with an embodiment of the present disclosure.

DESCRIPTION OF THE EMBODIMENTS

Figure 1:
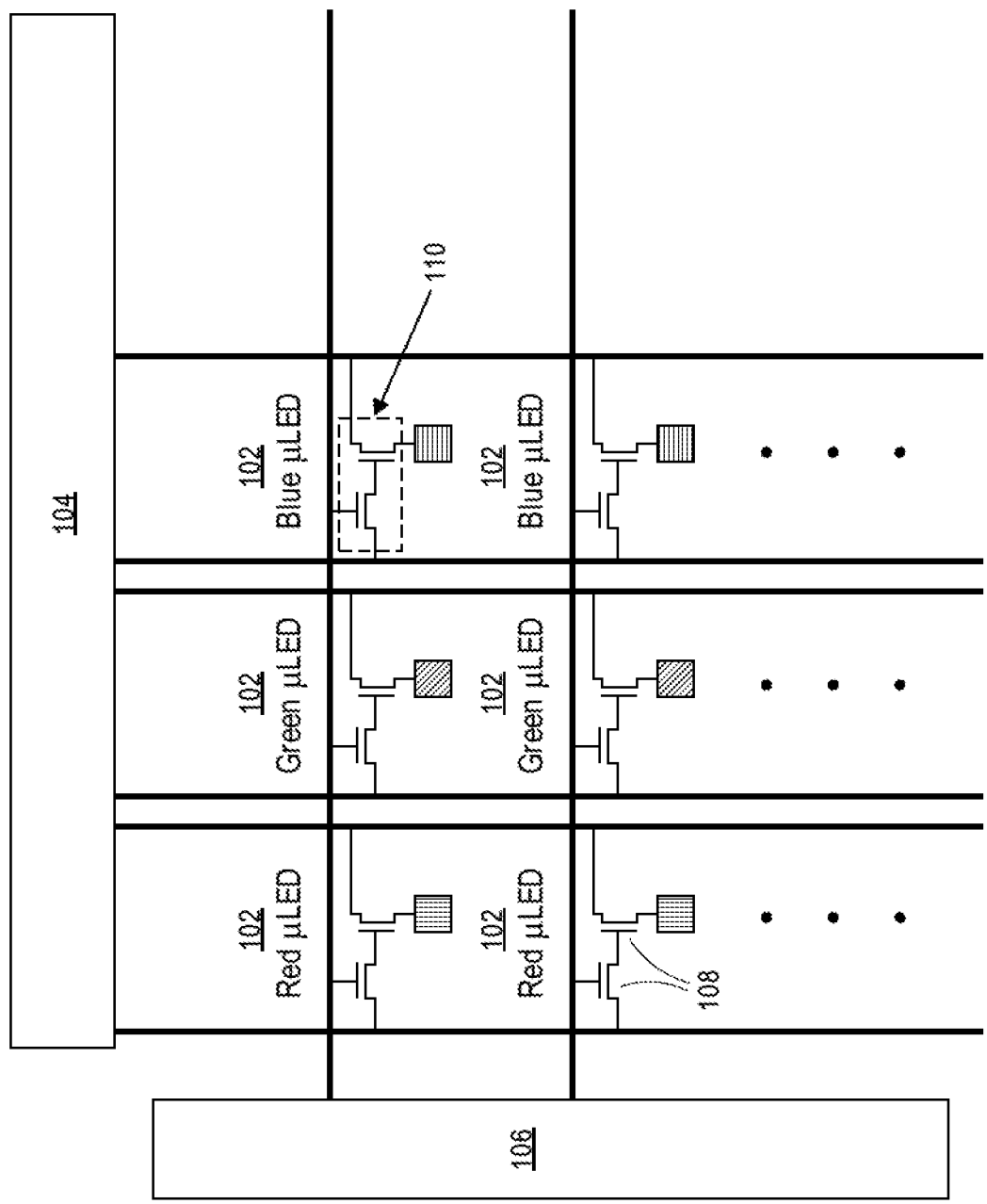
FIG. 1 is a schematic illustration of a micro LED display architecture, in accordance with an embodiment of the present disclosure.

Micro light-emitting diode (LED) displays, and fabrication and assembly of micro LED displays, are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and methods for micro LED assembly. In an embodiment, a device and method for fabricating full-color micro light emitting diode (μLED) displays by micro transfer assembly. Micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

To provide further context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured. The target acceptable defect density after such a transfer is approximately 1-2 ppm. This low defect density requirement may be achieved by transferring two micro LEDs for each color (red, green and blue), a so-called "redundancy strategy." However, transferring more micro LEDs for redundancy may result in higher manufacturing cost.

In a first aspect, in accordance with an embodiment of the present disclosure, micro LED displays, pixel architectures and assembly apparatuses are described.

FIG. 1 is a schematic illustration of a micro LED display architecture, in accordance with an embodiment of the present disclosure. Referring to FIG. 1, micro LEDs 102 are arranged in a matrix. The micro LEDs are driven through "Data Driver" 104 and "Scan Driver" 106 chips. Thin film transistors 108 are used to make "pixel driver circuits" 110 for each micro LED. In an embodiment, the micro LEDs are fabricated on a silicon wafer then transferred to a glass substrate called "backplane" where the "pixel driver circuits" 110 have been fabricated using thin film transistors.

To provide further context, a state-of-the-art approach involves transfer with a stamp. For example, a stamp picks from the source wafer and the transfers to a target substrate where micro LED devices are assembled with driving electronics to provide a display. The approach, however, requires the need for pick up, bond, and release mechanisms. The approach is typically slow and expensive, and requires unique tooling. Furthermore, it may be expensive to manufacture displays larger than 2 inches in diagonal, and the process may be associated with low yield due to high defect density.

In accordance with one or more embodiments of the present disclosure, source wafers are used that have red green blue (RGB) pixels or chips. Wafer-to-wafer type bonding equipment and process technologies may be used to directly transfer micro LEDs from a source wafer to a target display backplane substrate. In one embodiment, a multiple display pixel architecture is used to provide more than two micro LEDs per color per pixel, enabling a reduction in overall defect density on a produced display.

Advantages of implementing embodiments described herein may include, but need not be limited to, one or more of (1) low manufacturing cost (e.g., as accomplished by transferring red-green-blue micro LED pixels in one pass from a silicon wafer to a "standard" display backplane, (2) high yield (e.g., a result of due micro LED redundancy and pixel architecture used, and/or (3) lower risk on equipment development since existing wafer-to-wafer bonding tools may be used.

It is to be appreciated that, in a typical display, each pixel includes Red, Green and Blue (RGB) subpixels controlled independently by a matrix of transistors. For a μLED display, individual, small LED chips are used as the sub-pixel. Unlike organic LEDs (OLEDs), inorganic LEDs require high processing temperatures (e.g., greater than 1000° C.) and cannot be "grown" and patterned directly on top of a transistor matrix. In most cases, the micro LED chips are therefore manufactured separately and then positioned and connected to the transistor matrix via a pick and place process. Volume production at costs compatible with target applications still faces multiple engineering and manufacturing challenges. Such challenges may include LED epitaxy quality and homogeneity, efficiency of very small μLEDs, sidewall effects, massively parallel chip transfer technologies (e.g., pick and place) with position accuracy and high throughput, cost, handling of small die, etc., interconnects, color conversion, defect management, supply chain, and/or cost of production.

It is also t be appreciated that, like OLED, μLED technology is an emissive display technology. However, due to the inorganic nature of the emitting materials, their efficiency and narrow emission bands, μLEDs also offer the prospect of significantly improved performance in terms of energy consumption, color gamut, brightness, contrast (High Dynamic Range), long lifetime and environmental stability (e.g., no or low sensitivity to air and moisture), and/or compatibility with flexible backplane technologies to enable curved or flexible displays.

In accordance with one or more embodiments of the present disclosure, for a nanowire LED structure and pixel arrangement, nanowire LEDs that have superlambertian radiation pattern are used. The superlambertian radiation pattern may be due to the LED contact structure, an example of which is described below in association with FIG. 2. In one embodiment, light is created in a quantum well of a nanowire structure and reflected by a metal electrode. Subpixels of such nanowires may be arranged on a backplane pixel as shown in FIG. 3, and on a donor wafer as shown in FIG. 4, described below.

Figure 2:
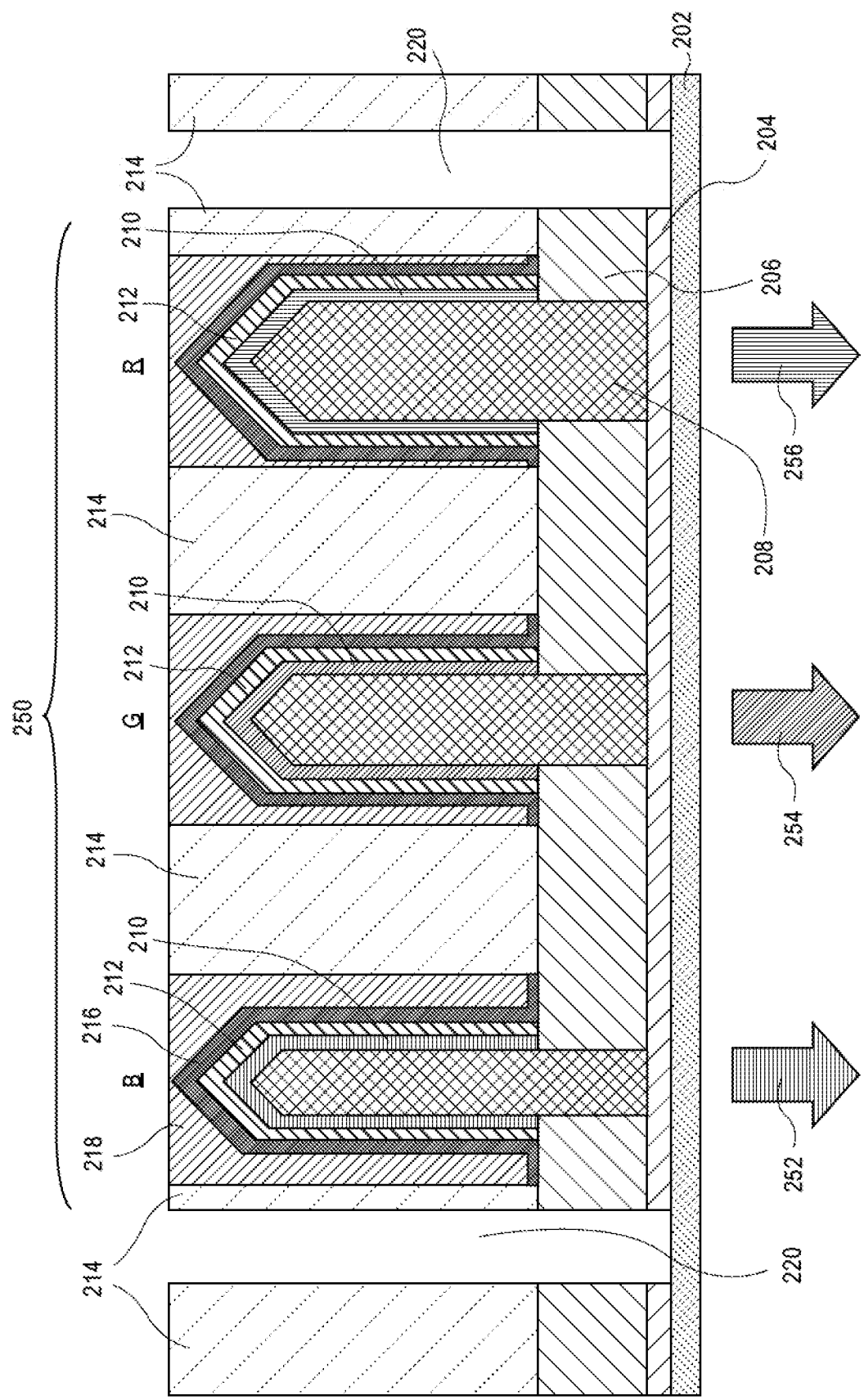
FIG. 2 illustrates a cross-sectional view of a red-green-blue subpixel (an RGB subpixel) with three nanowire LEDs, in accordance with an embodiment of the present disclosure.

FIG. 2 illustrates a cross-sectional view of a red green blue subpixel (an RGB subpixel) with three nanowire LEDs, in accordance with an embodiment of the present disclosure. Referring to FIG. 2, although shown as three different color micro-LEDs across (e.g., blue, green, red from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 2. In another embodiment, four micro LEDs are arranged a 2×2 arrangement. In another embodiment, nine micro LEDs are arranged a 3×3 arrangement (three red micro LEDs, three green micro LEDs, and three blue micro LEDs), etc. It is to be appreciated that a micro LED is composed of an array of nanowire LEDs. The number of nanowire LEDs per one micro LEDs is at least one. For example, a 10 micron×10 micron micro LED may be composed of 90 nanowire LEDs connected in parallel to emit light of a specific color. It is further to be appreciated that, with respect to FIG. 2, the micro LEDs are represented by one nanowire each for illustrative purposes. This in general is not the case. Typically, one micro LED will be composed of more than one nanowire LED. Also, in FIG. 2, one example arrangement is shown. That is, the three colors are adjacent to each other. However, in some cases, the micro LEDs of different colors are separated on the source wafer by a distance that may be half of the display pixel pitch, for example.

With reference again to FIG. 2, in a particular embodiment, a source micro LED wafer (such as a silicon wafer) has "RGB Chips" monolithically grown thereon. The silicon wafer is first coated with an aluminum nitride (AlN) buffer layer 202, e.g., having a thickness of approximately 50 nanometers. The AlN buffer layer 202 may have a bandgap of about 6 eV and may be transparent to infrared radiation. A metal-based nucleation layer (MNL) 204 is then deposited on the AlN buffer layer 202. The MNL 204 may have a thickness in the range of 30-100 nm and may be crystalline or polycrystalline. A silicon nitride mask 206 is then deposited on the MNL. Lithography may then be used to open apertures in the silicon nitride mask 206 mask with diameters carefully chosen to accommodate the subsequent formation of LEDs that emit red, green, and blue colors. N-type GaN nanowire cores are then grown, e.g., by metal organic chemical vapor deposition (MOCVD), as seeded from the MNL 204. The nanowire cores may have diameters in the range 50 nm to 250 nm.

In an embodiment, after fabrication of further LED layers, example of which are described below, the starting source micro LED wafer (such as a silicon wafer) is removed to leave the layers 202 and 204 exposed. In one such embodiment, blue light 252 may be emitted from LED (B) in the direction of the arrow, green light 254 may be emitted from LED (G) in the direction of the arrow, and/or red light 256 may be emitted from LED (R) in the direction of the arrow.

Referring again to FIG. 2, indium gallium nitride (InGaN) shells 210 are grown around the GaN cores 208, e.g., using MOCVD. The amount of indium in the InGaN shells 210 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For red (R) color emission, the indium content is approximately 40%. A p-type GaN cladding layer 212 may then be formed around the InGaN shells 210, e.g., using MOCVD. The core-shell nanowires are the covered by an insulating material layer 214, e.g., a silicon oxide (SiOx) layer. A lithography and etch may then be used to expose the p-GaN cladding layers 212 for all color core-shell nanowire structures. Atomic layer deposition may then be used to conformally deposit a metal layer 216 on the p-GaN cladding layers 212. A metal fill process may then be performed to fill in contact metals 218 for the micro LED structures.

Referring more generally to FIG. 2, a semiconductor structure includes a plurality of pixel elements 250. Each of the pixel elements 250 includes a first color nanowire LED, a second color nanowire LED (the second color different than the first color), and a pair of third color nanowire LEDs (the third color different than the first and second colors). A continuous insulating material layer 214 is laterally surrounding the first color nanowire LED, the second color nanowire LED, and the pair of third color nanowire LEDs. Adjacent pixel elements are separated from one another by a trench 220 between corresponding continuous insulating material layers 214. It is to be appreciated that more than three colors may be fabricated. For example, structures may be fabricated for red, green, yellow or blue emission. In another example, structures may be fabricated for red, orange, green, or blue emission.

In an embodiment, for each of the pixel elements 250, the first color is red, the second color is green, and the third color is blue. In another embodiment, for each of the pixel elements 250, the first color is red, the second color is blue, and the third color is green. In another embodiment, for each of the pixel elements 250, the first color is blue, the second color is green, and the third color is red. In an embodiment, for each of the pixel elements 250, the first color nanowire LED, the second color nanowire LED, and the pair of third color nanowire LEDs have a 2×2 arrangement. In another embodiment, a structure referred to as "monolithic blue and green only" may be fabricated. In such a case, three times as many blue micro LEDs as the green micro LEDs are fabricated. Then, after transfer of the blue and greed micro LEDs to the display backplane (at one shot of transfer), quantum dots are added on some of the blue micro LEDs to convert that blue to red color.

Figure 3A:
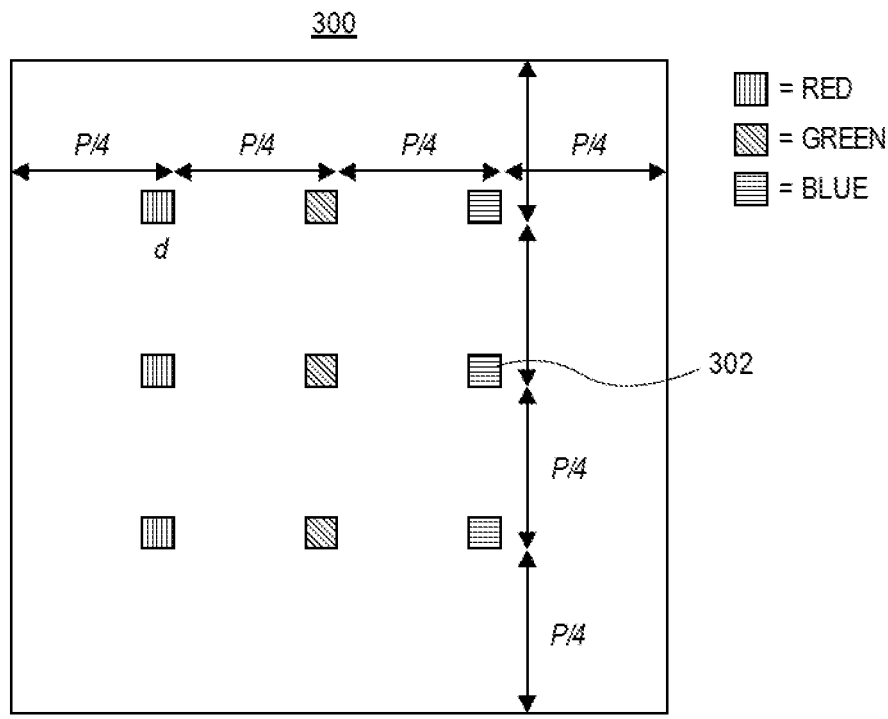
FIG. 3A illustrates a plan view of a pixel architecture, in accordance with an embodiment of the present disclosure.
Figure 4:
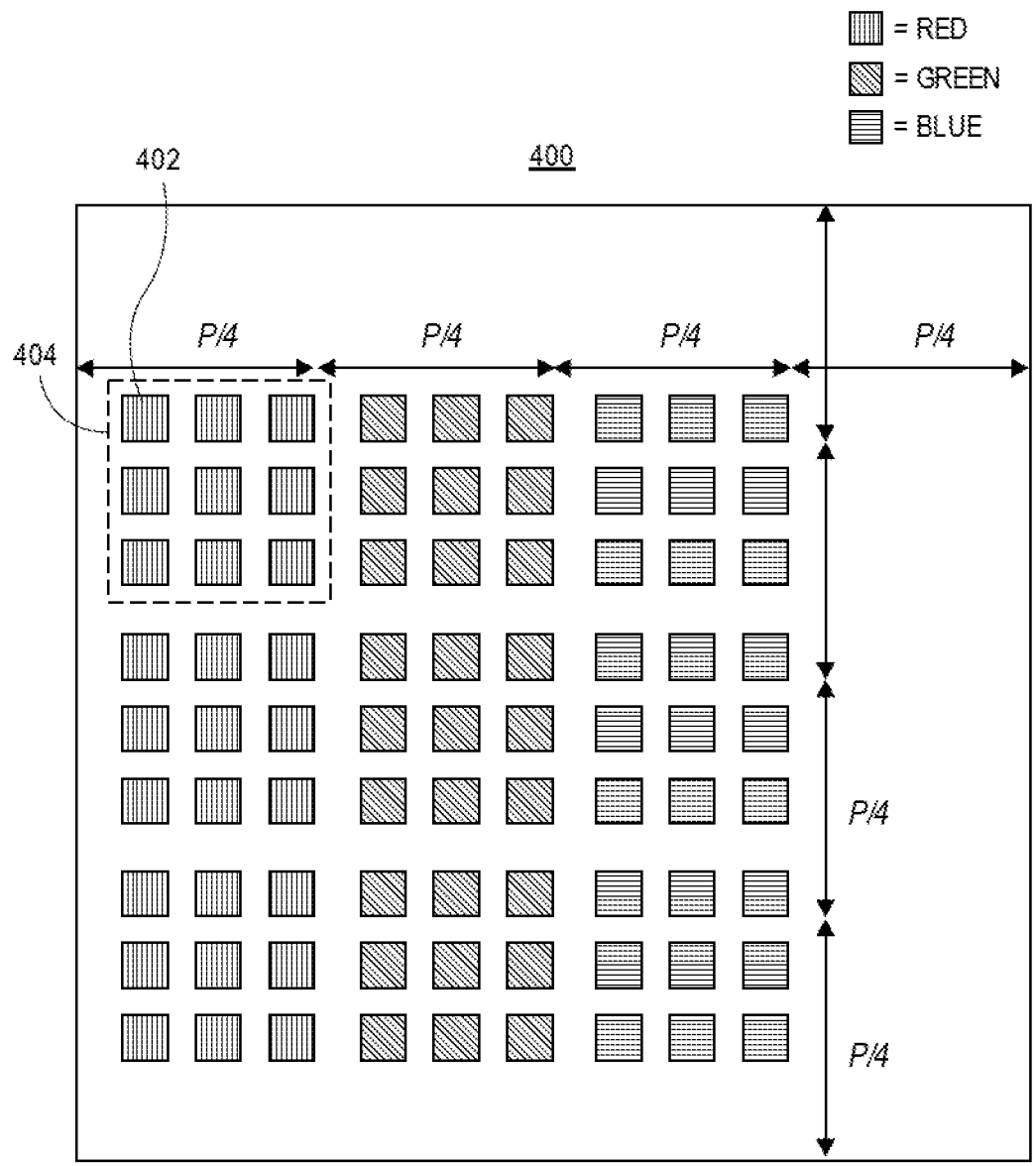
FIG. 4 illustrates a plan view of an arrangement of micro LEDs (as blocks or groupings) on a donor wafer, in accordance with an embodiment of the present disclosure.

FIG. 3A illustrates a plan view of a pixel architecture, in accordance with an embodiment of the present disclosure. Referring to FIG. 3A, a display backplane pixel 300 includes three micro LEDs 302 per color. In one embodiment, three micro LEDs 302 per color are transferred to ensure that defect density in the final display meets target specifications of approximately 1 ppm.

Figure 3B:
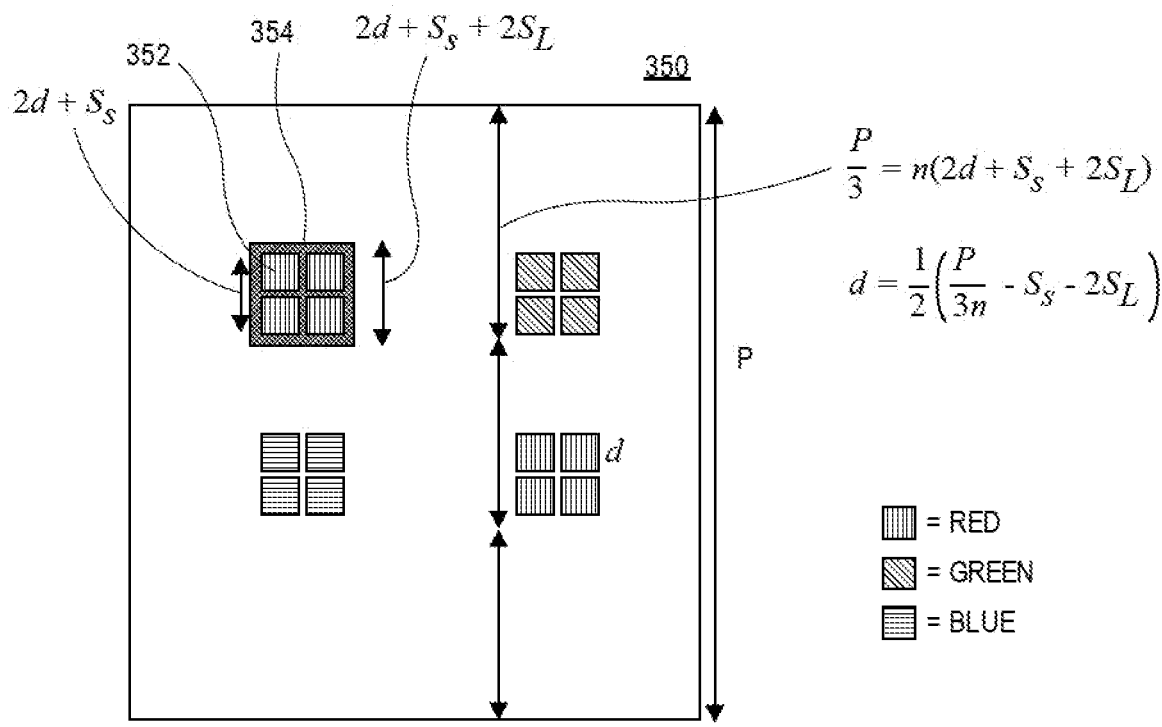
FIG. 3B illustrates a plan view of a pixel architecture on a display, in accordance with an embodiment of the present disclosure.

FIG. 3B illustrates a plan view of a pixel architecture 350 on a display, in accordance with an embodiment of the present disclosure. Referring to FIG. 3B, at least four micro LEDs 352 per color (shown as "blocks" 354) are transferred to ensure that defect density in the final display meets specifications of approximately 1 ppm. For architecture 350, d is the size of the micro LED (e.g., 2-5 µm), P is the pixel pitch on the display (e.g. 60 to 120 µm), SS and SL are small and large street sizes (e.g., SS=0.2-0.5 µm, SL=0.5-2 µm), and n is the number of micro LED blocks 354 made of 2×2 micro LEDs per pixel pitch. The number of displays per wafer is proportional to the square of n.

FIG. 4 illustrates a plan view of an arrangement 400 of micro LEDs 402 (as blocks or groupings 404) on a donor wafer, in accordance with an embodiment of the present disclosure. Referring to FIG. 4, P is the pixel pitch on the display.

In accordance with an embodiment of the present disclosure, addressing both cost and defectivity requirements, monolithic red, green and blue pixels are manufactured on a wafer and then transferred, as opposed to transferring individual micro LEDs with different colors from three separate source wafers sequentially. As described herein, source wafers are fabricated having individual red green blue (RGB) pixels (chips) thereon. Wafer-to-wafer bonding equipment and process technologies are then implemented to transfer micro LEDs from a source wafer to a target display backplane substrate, either directly or through an intermediate carrier plate. Thus, it is to be appreciated that typically three colors are transferred at the same time. It is not necessarily the case that "one RGB pixel" is transferred. Rather, it may be the case that one "whole" pixel is transferred. In another case, red, green, and blue micro LEDs are spaced appropriately on the wafer such that when they are transferred to the display backplane, they will land on pre-designated contact pads that may be separated by half of the pixel pitch or one quarter of the pixel pitch or other similar large enough spacing to prevent color bleeding.

A micro transfer apparatus may be used to bond LED pixels to a display backplane. In an example, FIG. 5 illustrates a cross-sectional view of a schematic of a display bonder apparatus, in accordance with an embodiment of the present disclosure.

Figure 5:
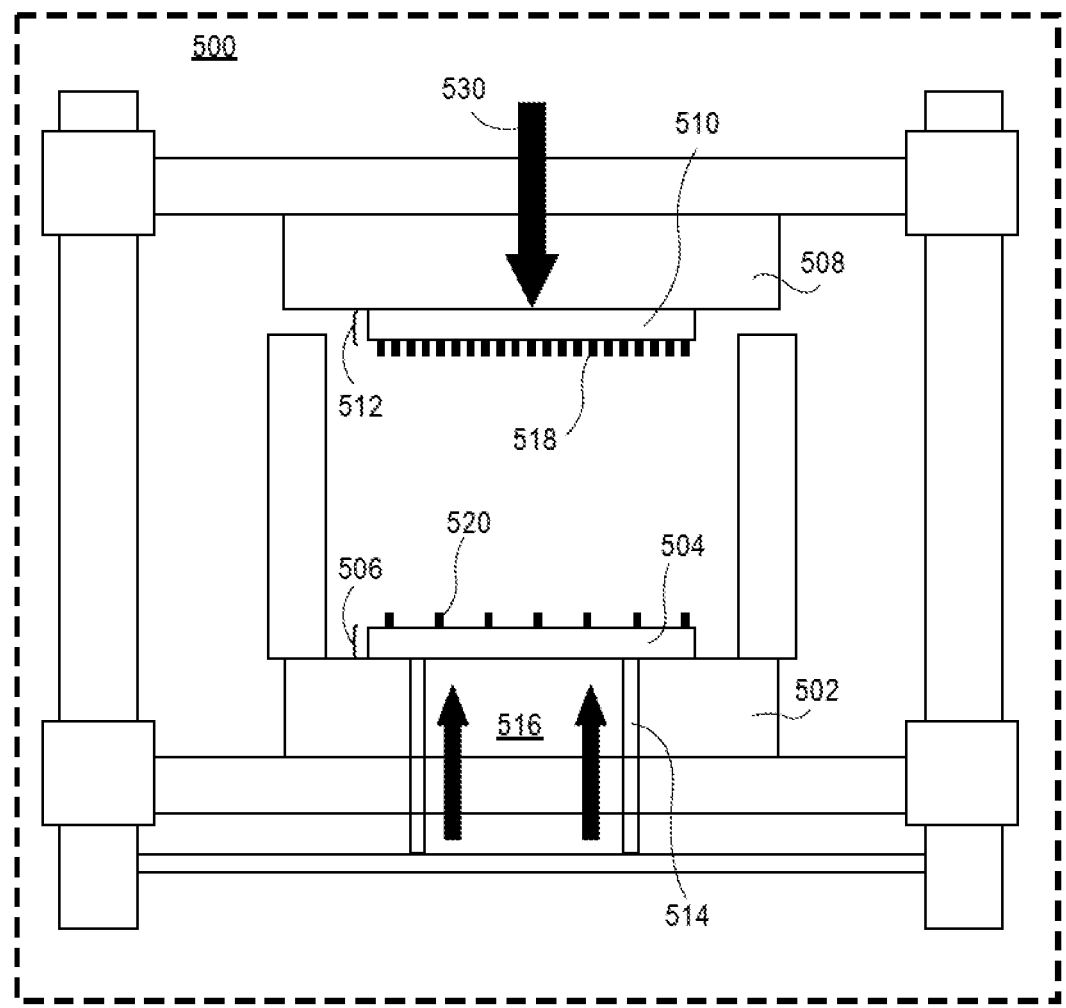
FIG. 5 illustrates a cross-sectional view of a schematic of a display bonder apparatus, in accordance with an embodiment of the present disclosure.

Referring to FIG. 5, a display bonder apparatus 500 includes a first support 502 for holding a display backplane substrate 504 in a first position 506. A second support 508 is for holding a donor wafer 510 such as a temporary glass carrier substrate (or, alternatively, a silicon wafer) in a second position 512. The second position 512 is over the first position 506. In one embodiment, a piston 514 is coupled to the first support 502. The piston 514 is for moving the display backplane substrate 504 from the first position 506 toward the second position 512. Further, the piston 514 applies a force 516 to the display backplane substrate 504 to bond light-emitting diode (LED) pixel elements 518 on the donor wafer 510 to metal bumps 520 on the display backplane substrate 504. In an embodiment, the display bonder apparatus further includes an ultra-violet (UV) light source 530 coupled to the second support 508. The UV light source 530 may be used for laser irradiation and/or ablation, e.g., as directed through a temporary glass carrier to release LED pixel elements 518 from an adhesive layer on the donor wafer 510.

In an embodiment, the display bonder apparatus 500 is used in a transfer process where a micro LED source wafer (e.g. temporary glass substrate or silicon source wafer) is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 516 on the outer surface of the display substrate. An exemplary such bonding process is described below in association with FIGS. 16A-16F. The force 516 may be applied to the center of the display substrate with a piston-type mechanism. The bonder apparatus 500 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

Figure 6A:
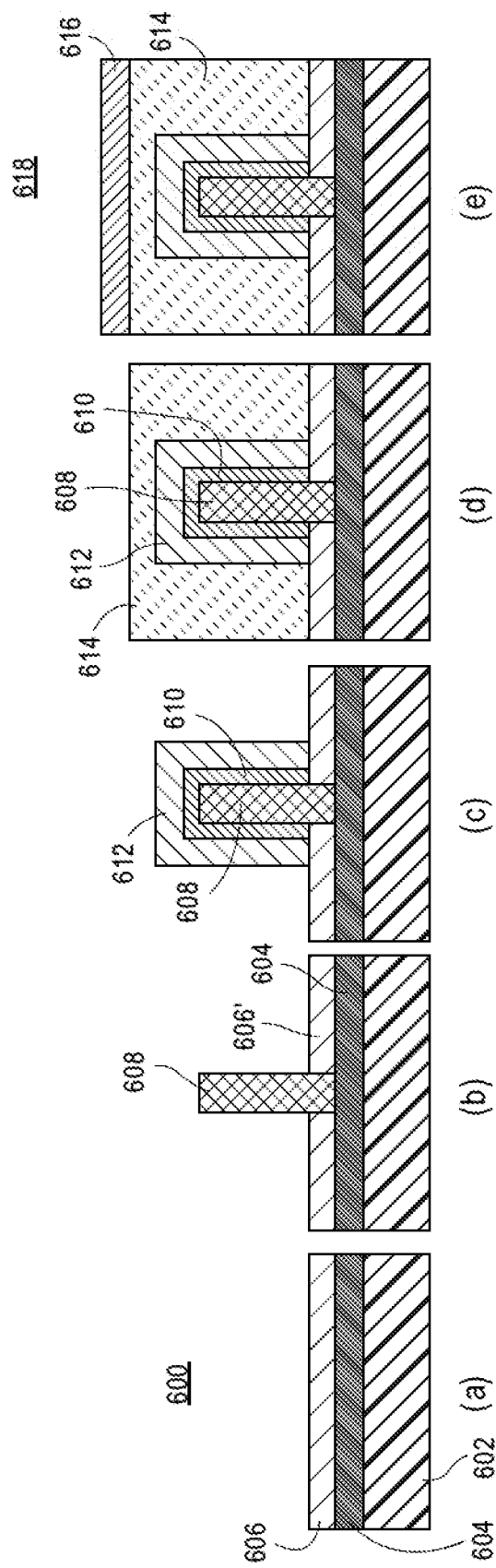
FIGS. 6A and 6B illustrate cross-sectional views of a method of fabricating and transferring a pixel structure, in accordance with an embodiment of the present disclosure.
Figure 6B:
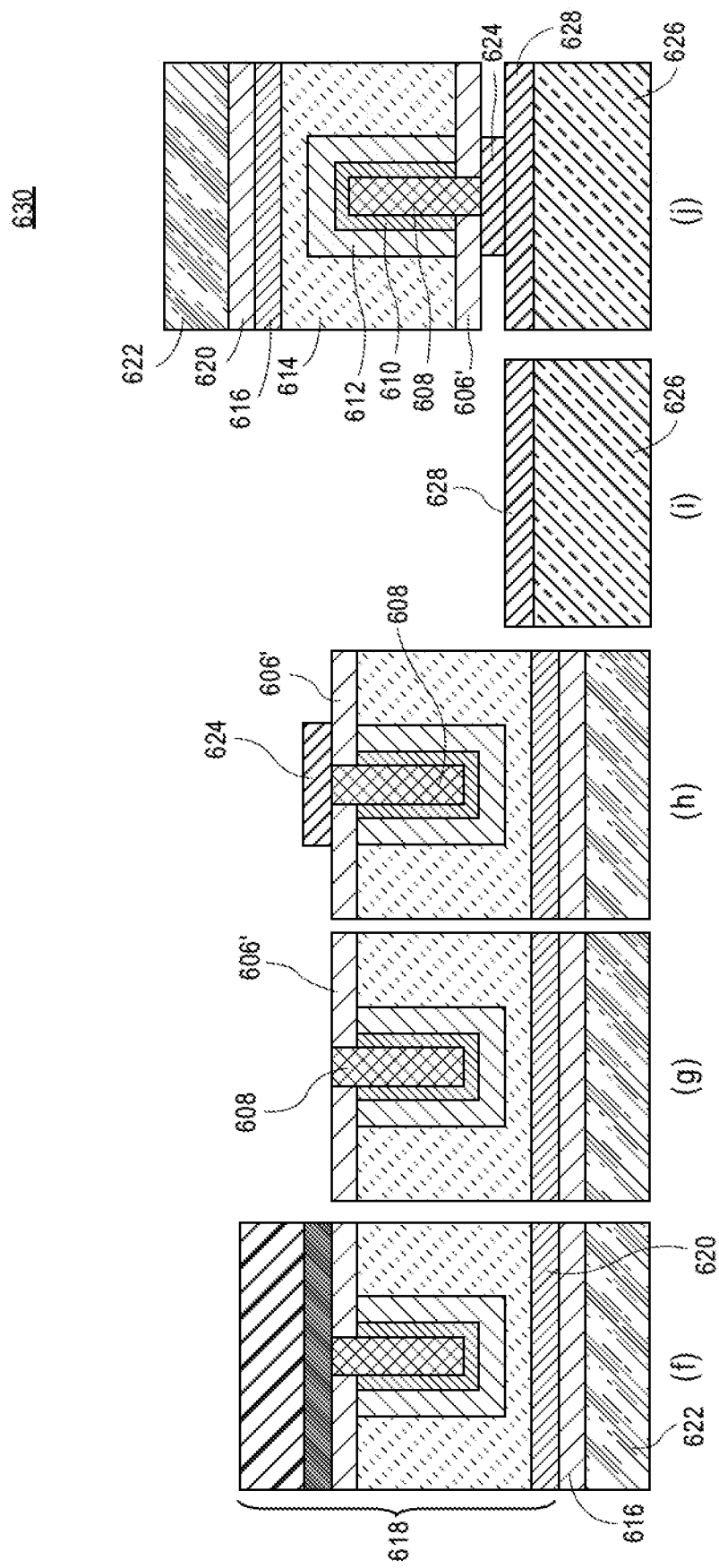

As an exemplary display assembly process, FIGS. 6A and 6B illustrate cross-sectional views of a method of fabricating and transferring a pixel structure, in accordance with an embodiment of the present disclosure.

Referring to part (a) of FIG. 6A, an exemplary method of fabricating RGB chips on a silicon wafer and then transferring the RGB chips to a display backplane begins with a starting structure 600. Starting structure 600 includes a silicon wafer 602, a nucleation layer 602 (e.g., an aluminum nitride/titanium nitride stack), and silicon nitride mask layer 606. Referring to part (b) of FIG. 6A, lithography is used to form openings in the silicon nitride mask 606 to form patterned silicon nitride mask 606', the openings each having a diameter of approximately 100 nanometers. GaN nanowires 608 are then epitaxially grown in the openings. Referring to part (c) of FIG. 6A, epitaxy is used to grow a multi quantum well (MQW) layer or stack 610 (e.g., MQW=InGaN/GaN stack) and a cladding layer 612, such as a P-type GaN cladding layer. Referring to part (d) of FIG. 6A, a transparent metal layer 614, such as Indium Tin Oxide (ITO), is deposited. Referring to part (e) of FIG. 6A, an adhesion layer 616, such as an amorphous silicon layer, is formed.

Referring to part (f) of FIG. 6B, a glass wafer 622 coated with an adhesion layer 622, such as an amorphous silicon layer is bonded the structure of part (e) of FIG. 6A, e.g., using thermocompression bonding (TCB) at a temperature of, for example, less than 600 degrees Celsius. Referring to part (g) of FIG. 6B, the silicon wafer 602 and the nucleation layer 604 are removed, e.g., using IR laser ablation or wafer grinding. Referring to part (h) of FIG. 6B, a contact metal 624, such as copper, is formed (e.g., by deposition and patterning) to contact to the GaN nanowire 608. Referring to part (i) of FIG. 6B, a backplane 626 having a layer of conductive bumps 628, e.g., a layer of copper bumps, is provided. Referring to part (j) of FIG. 6B, TCB is used to bond for, e.g., Cu-to-Cu bonding (without the use of solder or gold) at a temperature of, for example, less than 450 degrees Celsius to provide structure 630. Although not depicted, UV irradiation through the glass wafer 622 can be used to "selectively release" the micro LEDs that are already bonded to the display backplane. In an embodiment, selective release is achieved by either using masks or UV laser placement controls.

Figure 7:
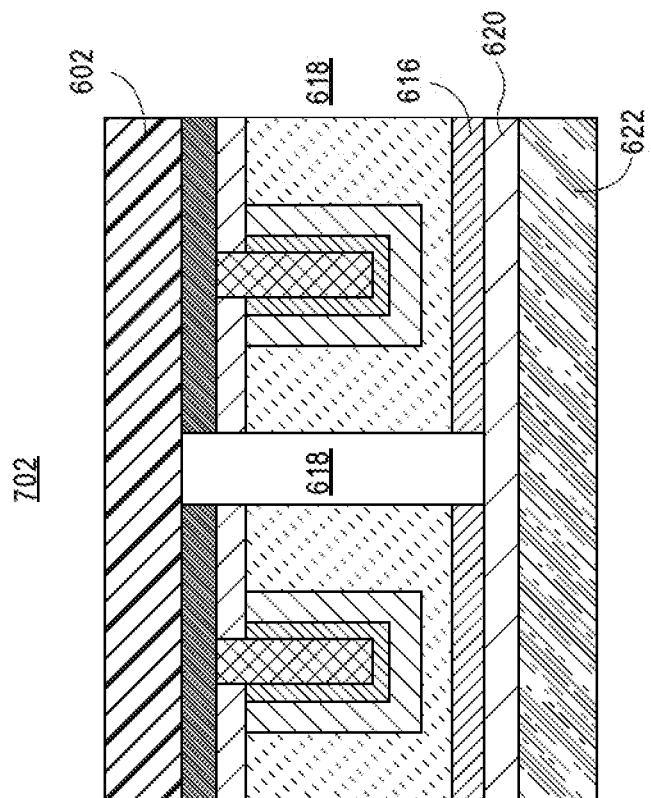
FIG. 7 illustrates cross-sectional views of structures having two micro LEDs at a stage of manufacturing corresponding to part (e) of FIG. 6A and part (f) of FIG. 6B, respectively, in accordance with an embodiment of the present disclosure.
Figure 7:
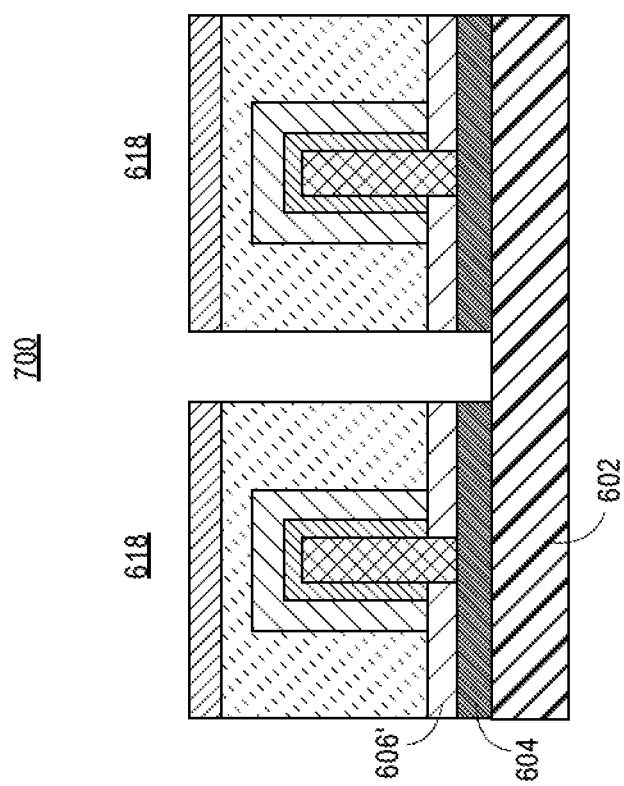

It is to be appreciated that numerous structures of the type 630 may be included on a single backplane 626. For example, FIG. 7 illustrates cross-sectional views of structures 700 and 702 having two micro LEDs at a stage of manufacturing corresponding to part (e) of FIG. 6A and part (f) of FIG. 6B, respectively, in accordance with an embodiment of the present disclosure. Referring to FIG. 7, individual LEDs may be separated from one another by etching a well through the transparent metal layer 614, through the silicon nitride layer 606' and through the nucleation layer 604.

Figure 8:
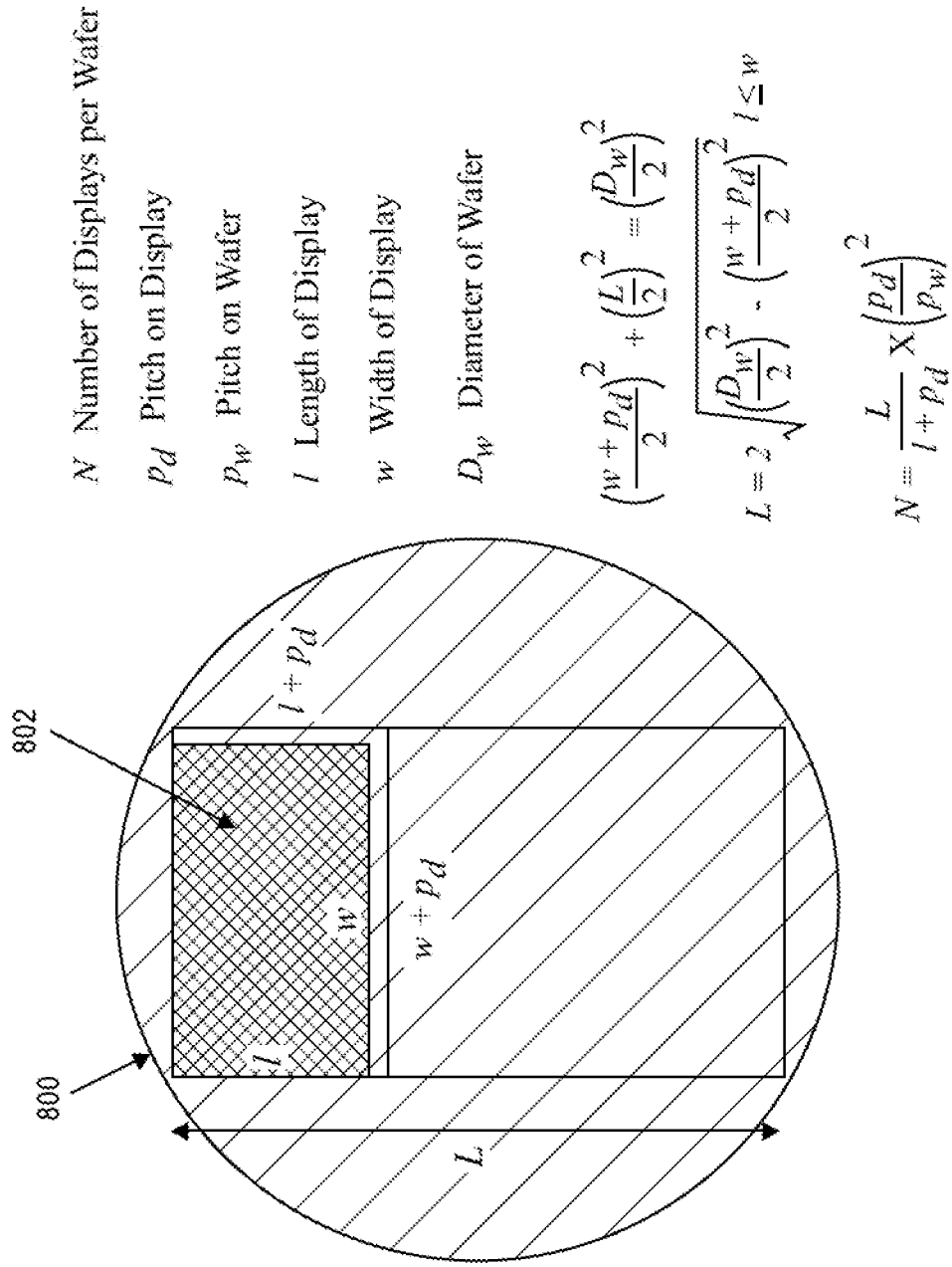
FIG. 8 is a schematic and related formulas illustrating parameters associated with an operation of bonding multiple rectangle displays from one round wafer, in accordance with an embodiment of the present disclosure.

FIG. 8 is a schematic and related formulas illustrating parameters associated with an operation of bonding multiple rectangle displays 802 from one round wafer 800, in accordance with an embodiment of the present disclosure. Referring to FIG. 8, display-to-micro LED bonding is based on a display backplane that is rectangular in shape while the temporary glass wafer 800 is circular in shape. Depending on the display size and wafer diameter, the number of displays that can be made from one wafer 800 can be determined. For example, if the display diagonal is 7 inches and the wafer diameter is 12 inches, approximately 20 displays per wafer can be fabricated if the pixel density is approximately 420 pixel per inch.

In accordance with one or more embodiments of the present disclosure, regarding source micro LED wafer specifications, a source micro LED wafer has "RGB Chips" monolithically grown on silicon wafers. In a particular embodiment, the silicon wafer is first coated with an aluminum nitride (AlN) buffer layer having a thickness of approximately 50 nanometers. The AlN may provide a dielectric material that has a bandgap of approximately 6 eV and is transparent to infrared radiation. A metal-based nucleation layer (MNL) is then deposited on the AlN layer. The MNL may have a thickness in the range of 25-50 nm and may have crystalline or polycrystalline morphology, where exemplary MNL materials include TiN, ZrN and HfN. A silicon nitride ($Si_3N_4$) mask layer (e.g. of about 300 nm in thickness) is then deposited on the MNL, e.g., using plasma enhanced chemical vapor deposition (PECVD). Lithography is then used to open holes in the $Si_3N_4$ mask with diameters carefully chosen to accommodate the subsequent formation of LEDs that emit red, green, and blue colors. Then, metal organic chemical vapor deposition (MOCVD) epitaxy is used to grow GaN nanowire cores seeding from the MNL. The nanowire cores may have diameters in the range 80 nm to 200 nm. Indium gallium nitride (InGaN) shells may then be grown around the GaN cores using, e.g., MOCVD epitaxial processing. In an embodiment, the amount of indium in InGaN depends on the GaN core diameter. For example, smaller core diameters can result in the growth of InGaN shells with smaller indium content. Larger core diameters can result in the growth of InGaN shells with larger indium content. For blue color emission, the indium content is approximately 20%. For green color emission, the indium content is approximately 31%. For red color emission, the indium content is approximately 41%. A p-type GaN cladding layer may then formed around the InGaN shells using, e.g., MOCVD epitaxial processing. In one embodiment, the core-shell nanowires are then covered by a silicon dioxide (SiOx) layer deposited by, e.g., PECVD, followed by chemical mechanical polishing for planarization. Lithography and etch is then used to expose the p-type GaN cladding layers for all color core-shell nanowire structures. Atomic layer deposition may then be used to conformally deposit a metal layer on the P—GaN cladding layers. A metal fill (e.g., using a CVD process) may then then be performed to fill in contact metals for the three color LED structures. Chemical mechanical polishing of the metal may be used for planarization. An exemplary structure resulting from the above described process is illustrated in FIG. 2, noting that layer 202 would be attached to the donor silicon substrate.

In a second aspect, in accordance with an embodiment of the present disclosure, ultralow power displays using hybrid monolithic RGB micro LED pixels are described.

Embodiments may be directed to a device and method for fabricating full-color micro light emitting diode (μLED) displays. To provide context, μLED displays promise 3×-5× less power compared to OLED displays. This saves battery life in mobile devices (e.g., notebook and converged mobility) and can enhance user experiences. A technology for fabricating monolithic red, green, and blue color LEDs enables low cost, low power μLED displays. Monolithic manufacturing of high efficiency green and blue μLEDs has been demonstrated using nanowire LED technology based on the GaN material system. However, it has been challenging to obtain high efficiency red micro LEDs using the same GaN material system. Thus, a device and a method are needed to realize low power, full color μLED displays.

Figure 9:
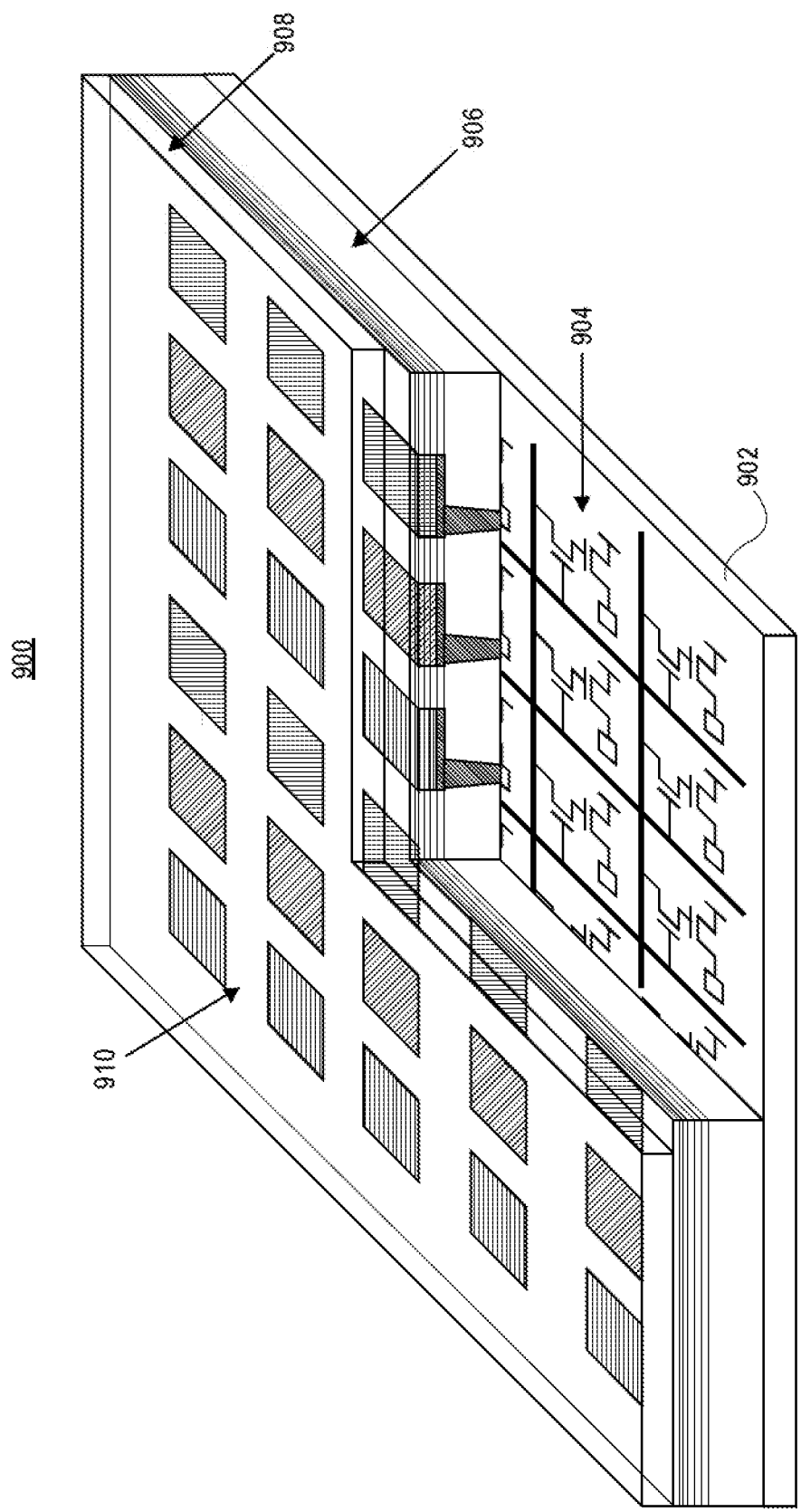
FIG. 9 illustrates a schematic of micro LED display architecture, in accordance with an embodiment of the present disclosure.

As an exemplary display architecture, FIG. 9 illustrates a schematic of micro LED display architecture, in accordance with an embodiment of the present disclosure. Referring to FIG. 9, a micro LED display 900 includes a backplane 902 having pixel circuits 904 thereon. An insulator 906 is over the pixel circuits 904. Micro LED layers 908 are included over the insulator 906. A transparent electrode 910 is over the micro LED layers 908.

It is to be appreciated that state of the art approaches involve fabricating discrete red, green, and blue μLEDs on separate wafers and then transferring the μLEDs using pick and place assembly to the display backplane. Typically, the red μLED is fabricated using AlInGaP material system, and the green and blue μLEDs are fabricated using an InGaN material system.

To provide further context, state of the art solutions are associated with high manufacturing cost due to the slow transfer rate of three types of μLEDs sequentially from source wafers to backplane. In addition, since three sequential transfers are needed, the probability of missing transfers increases and can result in low yield. This may be particularly impactful for displays used in smartphones (e.g., diagonal=5.1 inches), converged mobility tablets (e.g., diagonal=7 inches), and mobile notebooks (e.g., diagonal=11.6 inches-13.3 inches).

In accordance with one or more embodiments of the present disclosure, a monolithic red, green, and blue pixel is described. For the pixel, the red color μLED is fabricated from AlInGaP active layers, and the green and blue μLEDs are fabricated from InGaN active layers. The red, green and blue micro LEDs can be co-axial (core-shell) nanowire, nanopyramids, or axial nanowire, examples of which are described below in association with FIGS. 11A-11D. An exemplary fabrication scheme is described below in association with FIG. 12.

Figure 10A:
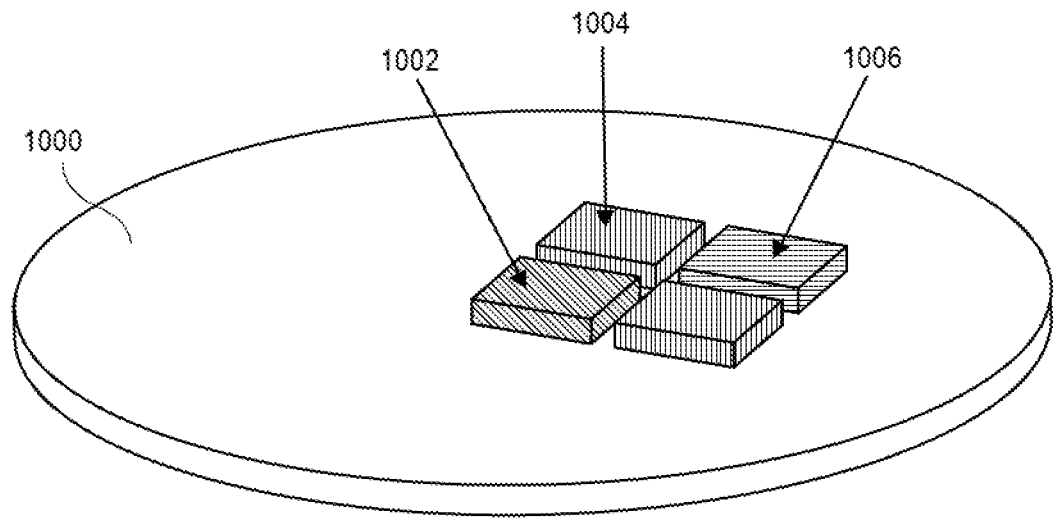
FIG. 10A illustrates an angled schematic of a silicon wafer having one representative "pixel" thereon, in accordance with an embodiment of the present disclosure.

FIG. 10A illustrates an angled schematic of a silicon wafer having one representative "pixel" thereon, in accordance with an embodiment of the present disclosure. Referring to FIG. 10A, silicon wafer 1000 has a pixel thereon including green 1002, red 1004 and blue 1006 μLEDs grown monolithically thereon. A redundant LED (unlabeled in FIG. 10A), such as a redundant red LED.

Figure 10B:
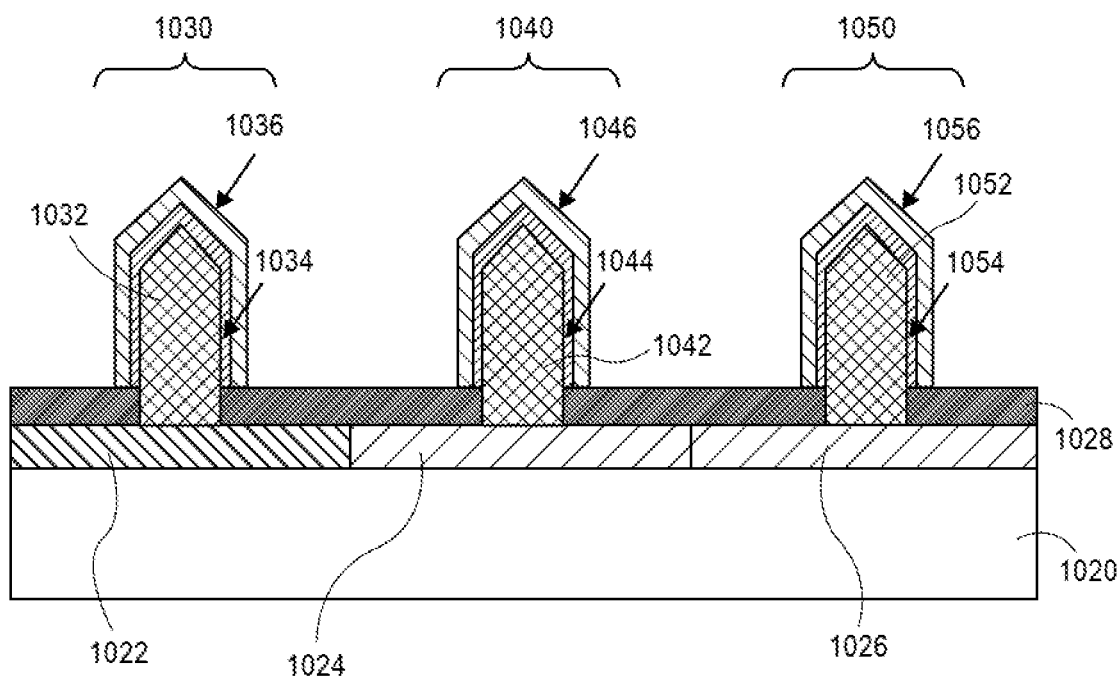
FIG. 10B illustrates a cross-sectional view of a monolithic RGB pixel, in accordance with an embodiment of the present disclosure.

FIG. 10B illustrates a cross-sectional view of a monolithic RGB pixel 1010, in accordance with an embodiment of the present disclosure. Referring to FIG. 10B, a Si (111) wafer 1020 includes a GaAs nucleation layer 1022, a first TiN/AlN nucleation layer 1024, and a second TiN/AlN nucleation layer 1026. A silicon nitride mask 1028 has openings exposing portions of the nucleation layers. A red micro LED 1030 includes an n-type GaInP core 1032, an AlInGaP active layer 1034, and a p-type GaInP cladding layer 1036. A green micro LED 1040 includes an n-type GaN core 1042, an InGaN active layer 1044, and a p-type GaN cladding layer 1046. A blue micro LED 1050 includes an n-type GaN core 1052, an InGaN active layer 1054, and a p-type GaN cladding layer 1056.

It is to be appreciated that hybrid structures may also be fabricated. In one such embodiment, green and blue LEDs are nanowires (core-shell or axial nanowires) and the red LED is a nanopyramid or micro pyramid. Other combinations include the green and blue LEDs being based on nanopyramids or micro pyramids with the red LED is based on nanopyramids or nanowires. As one such example, FIG. 10C illustrates a cross-sectional view of another monolithic RGB pixel, in accordance with another embodiment of the present disclosure.

Figure 10C:
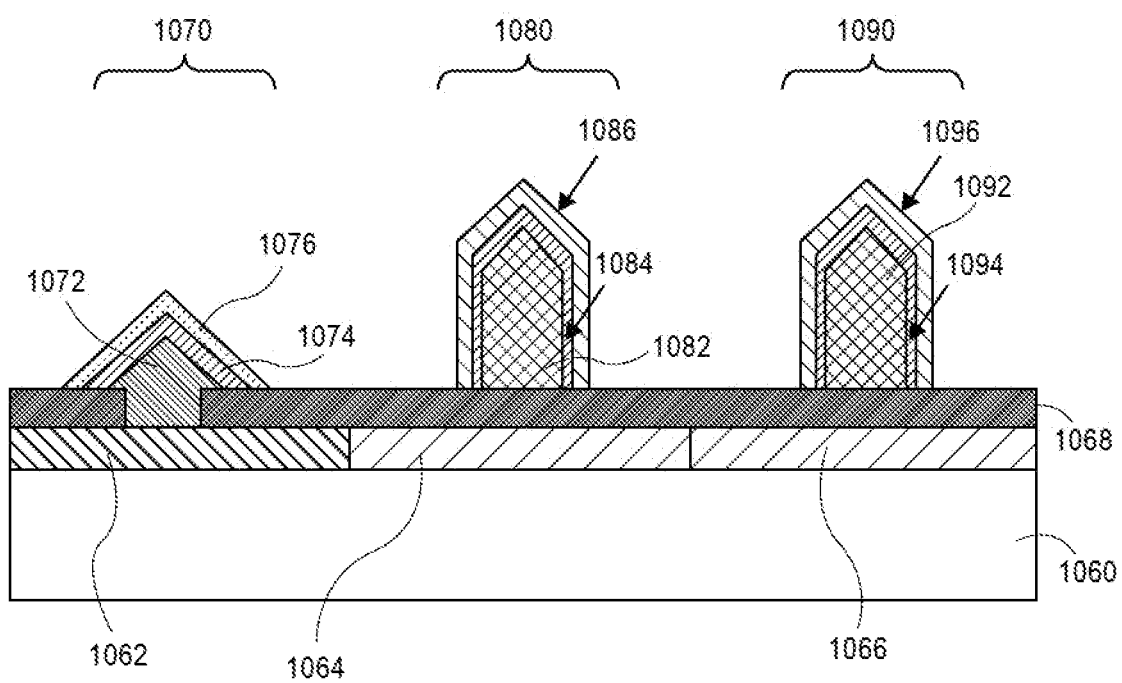
FIG. 10C illustrates a cross-sectional view of another monolithic RGB pixel, in accordance with another embodiment of the present disclosure.

Referring to FIG. 10C, a Si (111) wafer 1060 includes a GaAs nucleation layer 1062, a first TiN/AlN nucleation layer 1064, and a second TiN/AlN nucleation layer 1066. A silicon nitride mask 1068 has openings exposing portions of the nucleation layers. A red micro LED 1070 includes an n-type GaInP nanopyramid core 1072, an AlInGaP active layer 1074, and a p-type GaInP cladding layer 1076. A green micro LED 1080 includes an n-type GaN nanowire core 1082, an InGaN active layer 1084, and a p-type GaN cladding layer 1086. A blue micro LED 1090 includes an n-type GaN nanowire core 1092, an InGaN active layer 1094, and a p-type GaN cladding layer 1096.

Figure 11A:
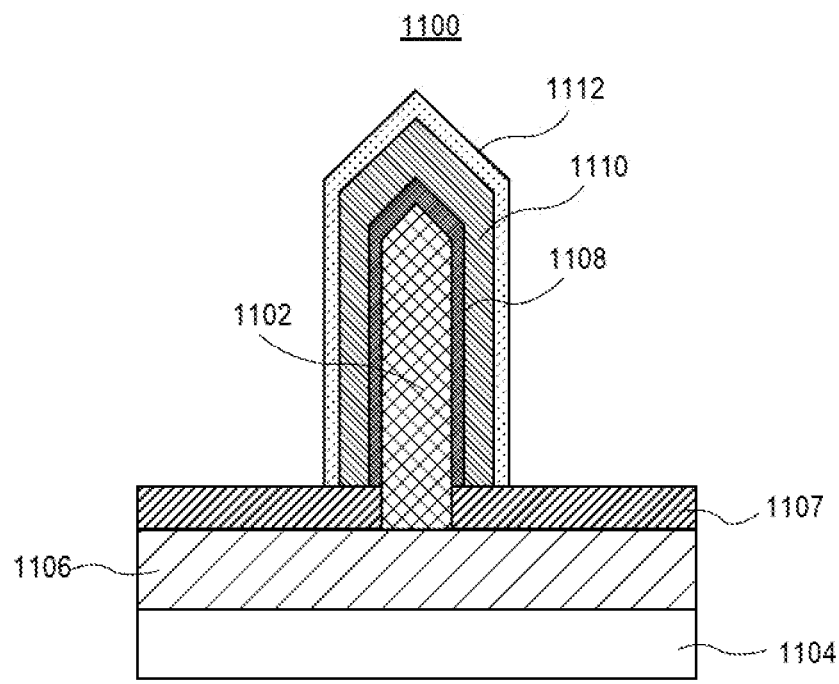
FIG. 11A illustrates a cross-sectional view of a GaInP or GaN nanowire based LED highlighting certain layers of the LED, in accordance with an embodiment of the present disclosure.

FIGS. 11A-11D illustrate options for micro LED structures. In a first example, FIG. 11A illustrates a cross-sectional view of a GaInP or GaN nanowire based LED highlighting certain layers of the LED, in accordance with an embodiment of the present disclosure. In the exemplary embodiment of FIG. 11A, an LED 1100 includes, in the case of a red LED, an n-type GaInP nanowire 1102 or, in the case of a blue or green LED, an n-type GaN nanowire 1102. The GaInP nanowire 1102 or GaN nanowire 1102 is above a substrate 1104, which may be a Si(111) substrate. An intervening nucleation layer 1106 has an opened mask layer 1107 thereon. In one embodiment, the n-type GaInP nanowire 1102 or the n-type GaN nanowire 1102 has a diameter in the range of 100-200 nanometers, and a height in the range of 1-10 microns.

In one embodiment, in the case of a red LED, the n-type GaInP nanowire 1102 is formed on a GaAs nucleation layer 1106. An active layer 1108 of AlInGaP is on the n-type GaInP nanowire 1102. A p-GaInP cladding layer 1110 is included on the active layer 1108. A conductive electrode layer 1112 may be formed on the p-GaInP cladding layer 1110, as is depicted. In one such embodiment, the AlInGaP 1108 emits red color (e.g., having a wavelength in the range of 610-630 nanometers).

In another embodiment, in the case of a blue or green LED, the n-type GaN nanowire 1102 is formed on a MN/AlN nucleation layer 1106 layer with MN=metal nitride, and where the metal can be Ti, Hf, Nb, etc. An active layer 1108 of InGaN is on the n-type GaN nanowire 1102. A p-GaN cladding layer 1110 is included on the active layer 1108. A conductive electrode layer 1112 may be formed on the p-GaN cladding layer 1110, as is depicted.

Figure 11B:
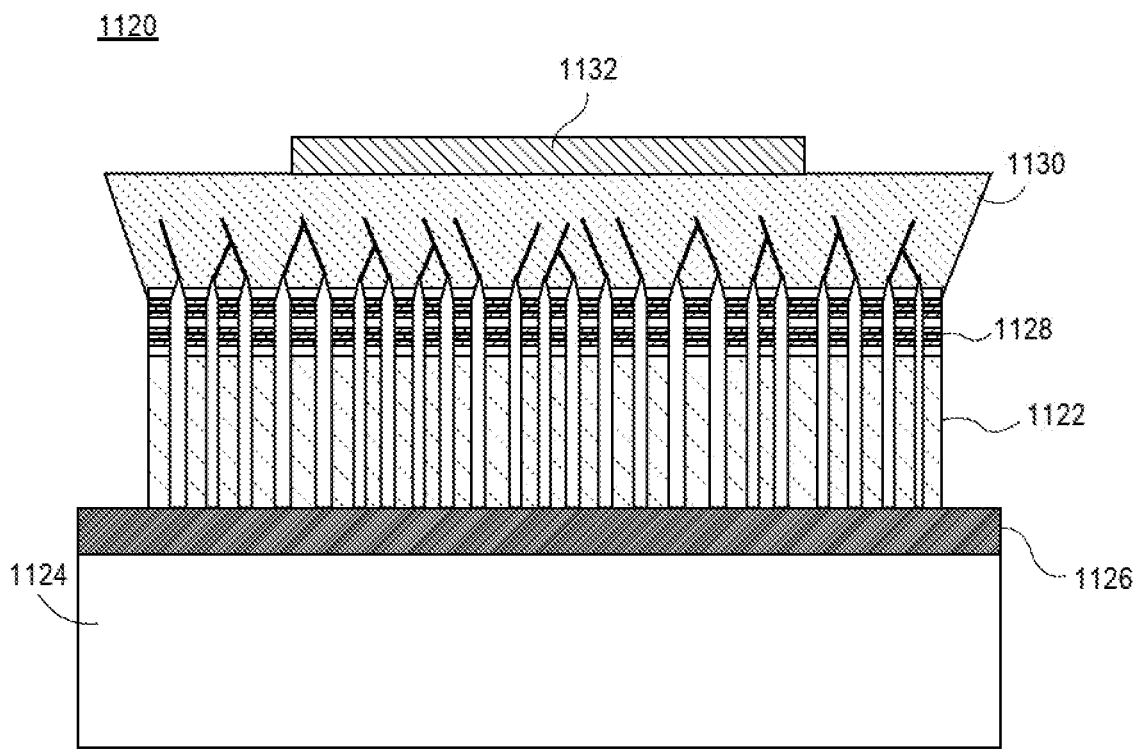
FIG. 11B illustrates a cross-sectional view of a micro-LED composed of multiple nanowire LEDs, in accordance with an embodiment of the present disclosure.

In a second example, FIG. 11B illustrates a cross-sectional view of a micro-LED composed of multiple nanowire LEDs, in accordance with an embodiment of the present disclosure. In the exemplary embodiment of FIG. 11B, a micro-LED 1120 includes an n-GaN nano-column 1122 above a substrate 1124, which may be an n-type Si(111) substrate. An intervening nucleation layer 1126, such as an AlN layer, is included between the n-GaN nano-column 1122 and the substrate 1124 or, alternatively, the nucleation layer 1126 may be omitted. An InGaN/GaN multi-quantum well device (MQD) stack 1128 is included on the n-GaN nano-column 1122. A p-GaN layer 1130 is on the multi-quantum well device (MQD) stack 1128. A transparent p-electrode 1132 is included on the p-GaN layer 1130.

It is to be appreciated that foundational geometries other than the above described nanowires may be used for LED fabrication. In a third example, in another embodiment, FIG. 11C illustrates a cross-sectional view of a nanopyramid or micropyramid based LED highlighting certain layers of the LED, in accordance with an embodiment of the present disclosure. In the exemplary embodiment of FIG. 11C, an LED 1140 includes an n-GaN (in the case of a blue or green LED) or n-GaInP (in the case of a red LED) nanopyramid 1142 above a substrate 1144, which may be a Si(111) substrate. An intervening nucleation layer 1146, such as described for FIG. 11A, has an opened mask layer 1147 thereon. An active layer 1148, such as described for FIG. 11A, is included on the n-GaN or n-GaInP nanopyramid 1142. A p-type cladding layer 1152, such as described for FIG. 11A, is included on the active layer 1148. It is to be appreciated that a micro LED may be composed of multiple nanopyramids connected in parallel. For example, a 5 micron×5 micron micro LED may be composed of, e.g., 20 nanopyramids.

In a fourth embodiment, FIG. 11D illustrates a cross-sectional view of an axial nanowire based LED highlighting certain layers of the LED, in accordance with an embodiment of the present disclosure. In the exemplary embodiment of FIG. 11D, an LED 1160 includes an n-GaN or n-GaInP axial nanowire 1162 above a substrate 1164, which may be a Si(111) substrate. An intervening active layer 1166, such as described for FIG. 11A, has an opened mask layer 1167 thereon. An active layer 1168, such as described for FIG. 11A, is included on the n-GaN or n-GaInP axial nanowire 1162. A p-type cladding layer 1172, such as described for FIG. 11A, is included on the active layer 1168.

Figure 12:
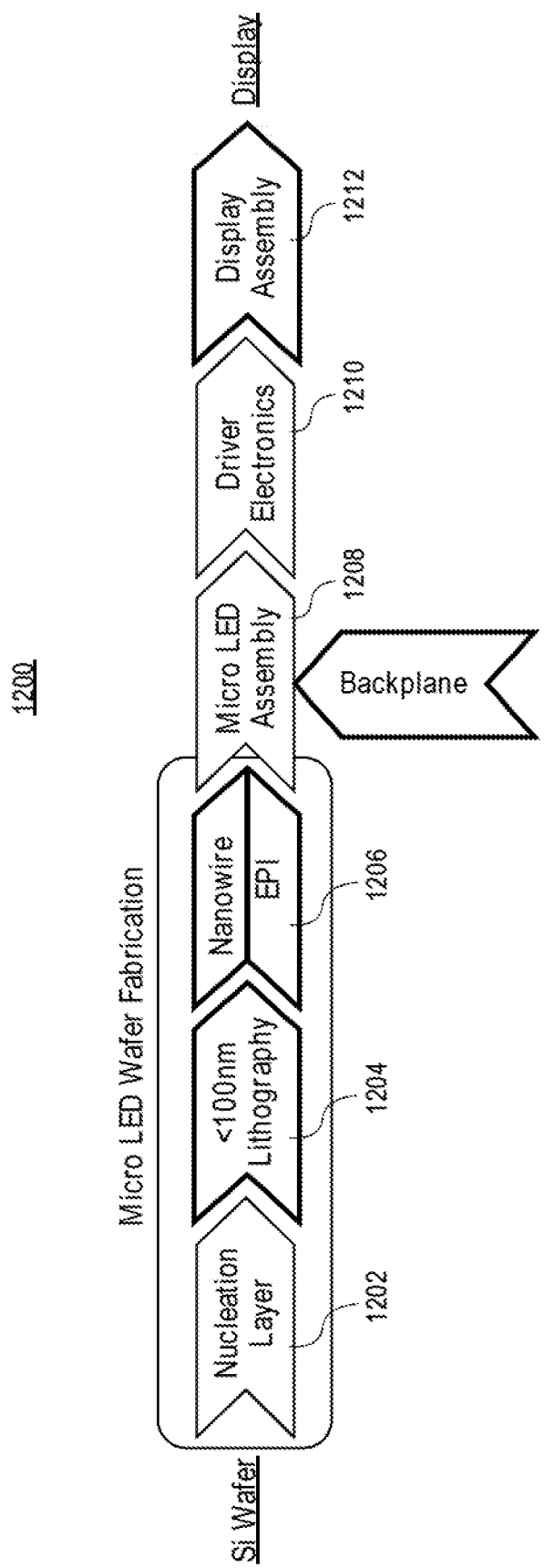
FIG. 12 is a flow diagram illustrating an RGB display production process, in accordance with an embodiment of the present disclosure.

In another aspect, FIG. 12 is a flow diagram 1200 illustrating an RGB display production process, in accordance with an embodiment of the present disclosure. Referring to flow diagram 1200, at operation 1202, a Si wafer has a nucleation layer formed thereon, such as an AlN nucleation layer, and MN/AlN nucleation layer or a GaAs nucleation layer, as are described above. At operation 1204, sub 100 nanometer lithography is used to pattern a layer on the nucleation layer, or to pattern the nucleation layer. At operation 1206, nanowire growth is performed on the nucleation layer, e.g., by epitaxial deposition. At operation 1208, a backplane is introduced into the micro LED assembly process. At operation 1210, driver electrons are fabricated. At operation 1212, display assembly is performed to finally provide a display.

Advantages of implementing embodiments described herein may include, but need not be limited to (1) low manufacturing cost (e.g., accomplished by transferring red-green-blue micro LED pixels in one pass from a silicon wafer to a display backplane resulting in faster transfer rate and higher yield (e.g., lower transfer-related defects on the display), (2) low power consumption (e.g., accomplished by realizing high efficiency red, green and blue micro LEDs at the same time), and/or (3) a projected power reduction of approximately 3-5× compared to OLED technology. In an embodiment, power reduction is achieved with micro LED displays based on the fabrication of LEDs with high power efficacies for all three color LED emitters.

Figure 13:
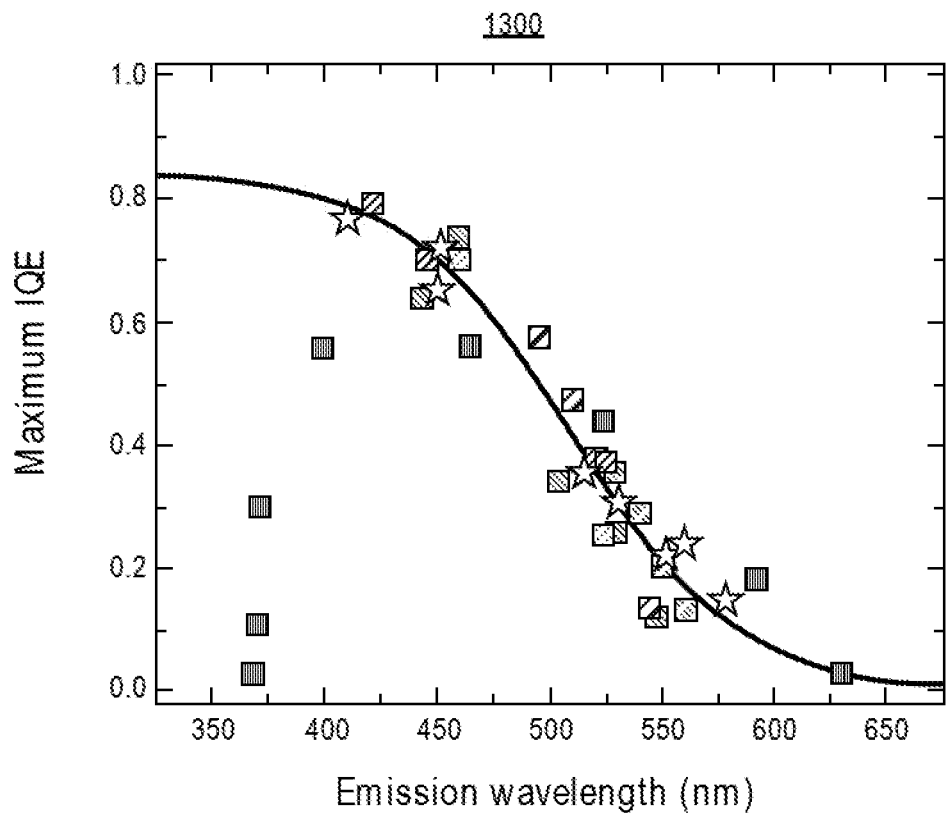
FIG. 13 is a plot of maximum IQE as a function of emission wavelength for a historical survey of experimental data of "planar" InGaN/GaN LED devices over the UV-to-Visible range, in accordance with an embodiment of the present disclosure.

To provide context, an issue with efficiency of GaN-based red micro LEDs for light emitting devices, such as light emitting diodes (LED), is that the emission wavelength is determined by the band gap of the active region of the LED together with thickness determined confinement effects. Often, the active region includes one or more quantum wells (QWs). For III-nitride based LED devices, such as GaN based devices, the active region (e.g., quantum well) material is preferably ternary, such as $In_xGa_{1-x}N$, where $0 \leq x \leq 1$. The band gap of such III-nitride can be dependent on the amount of In incorporated in the active region (e.g., in the QW(s)). A higher In incorporation can yield a smaller band gap and thus longer wavelength of the emitted light. InGaN may be a very attractive material for the development of various optical devices in the entire visible spectral range owing to the tenability of the bandgap energy by adjusting the indium content. A low-In-content InGaN-based blue light-emitting diode (LED) has exhibited an external quantum efficiency (EQE) of approximately 83%. However, the EQEs of long-wavelength LEDs emitting light in the green, yellow, orange, and red regions can be much lower. As an example, FIG. 13 is a plot 1300 of maximum IQE as a function of emission wavelength for a historical survey of experimental data of "planar" InGaN/GaN LED devices over the UV-to-Visible range, in accordance with an embodiment of the present disclosure. Referring to plot 1300, the maximum internal quantum efficiency (IQE) decreases as a function of wavelength.

To provide further context, critical factors causing low efficiency in high-In-content InGaN-based LEDs may include (1) defects in the InGaN active layer due to the lattice mismatch between InxGa1-xN and GaN (e.g., lattice mismatch between InN and GaN is 11%), and/or (2) the piezoelectric field in the strained InGaN active layers can become very large for high indium content, causing low internal quantum efficiency owing to electron-hole separation in InGaN multiple quantum wells. This can be particularly important for growing InGaN on c-plane GaN. For a/m-planes, however, the effect may be negligible.

Figure 14:
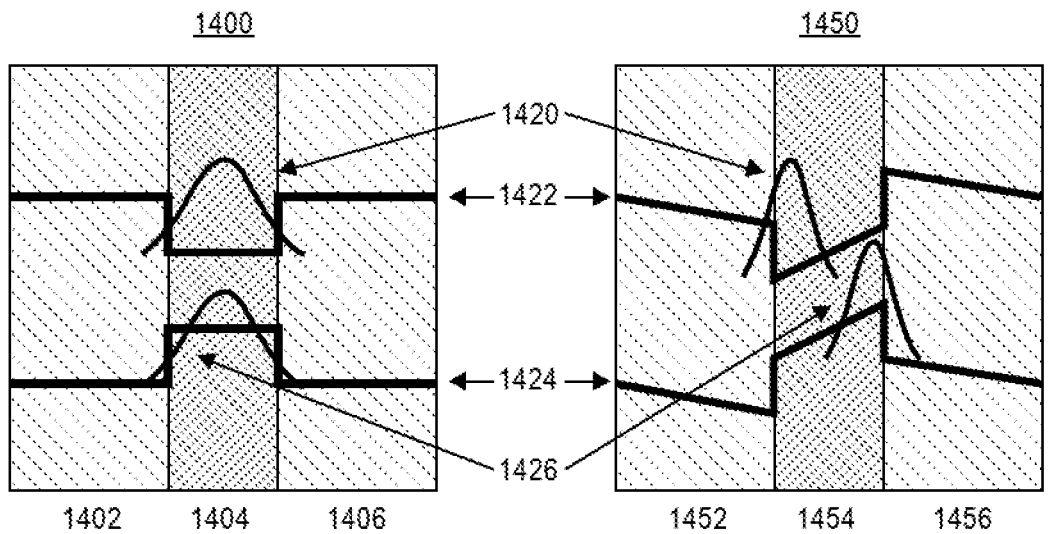
FIG. 14 is a schematic of band diagrams of GaN/InGaN/GaN quantum wells with different growth planes, in accordance with an embodiment of the present disclosure.

As an example, FIG. 14 is a schematic of band diagrams of GaN/InGaN/GaN quantum wells with different growth planes, in accordance with an embodiment of the present disclosure. Referring to FIG. 14, an a/m-plane structure 1400 is shown for GaN 1402, InGaN 1404 and GaN 1406 layers. A c-plane structure 1450 is shown for GaN 1452, InGaN 1454 and GaN 1456 layers. Corresponding parameters shown for the differing structures include electron wave function 1420, conduction band edge 1422, valence band edge 1424 and hole wave function 1426.

In accordance with an embodiment of the present disclosure, hybrid RGB pixels are fabricated and then the micro LED pixels are transferred from a source wafer to a display backplane to fabricated a micro LED display. In one embodiment, the hybrid RGB pixels are III-V/III-N RGB pixels. A starting wafer may be a silicon wafer, which may be as large as 12 inches in diameter. InGaN, GaAs, GaN, AlInP, and AlInGaP materials may be grown using metal-organic chemical vapor deposition (MOCVD). As an exemplary process flow, FIG. 15 illustrates cross-sectional views of various operations in a method of fabricating a monolithic pixel structure having hybrid nanowire composition, in accordance with an embodiment of the present disclosure.

Figure 15:
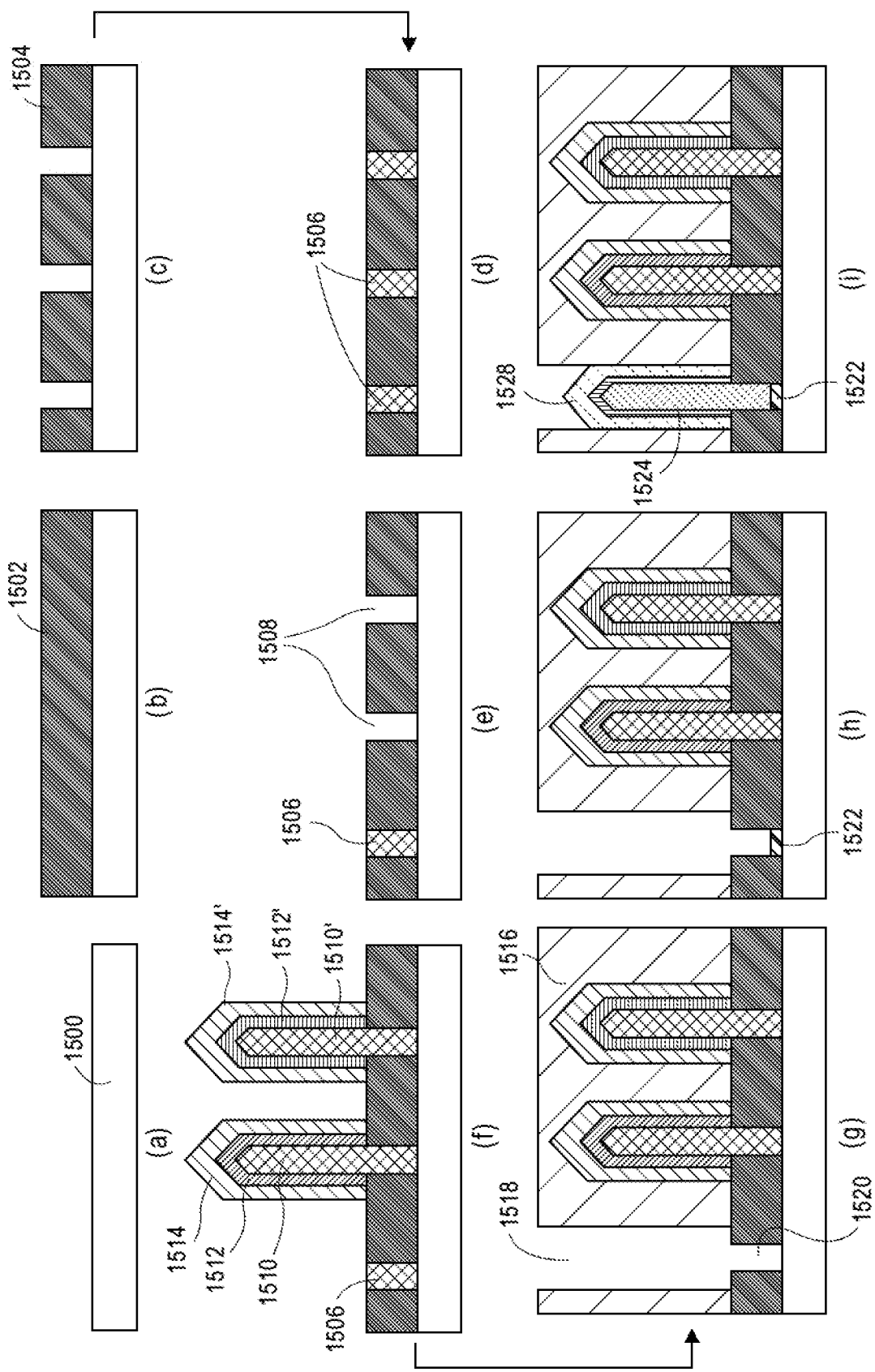
FIG. 15 illustrates cross-sectional views of various operations in a method of fabricating a monolithic pixel structure having hybrid nanowire composition, in accordance with an embodiment of the present disclosure.

Referring to part (a) of FIG. 15, (a) a starting silicon (111) wafer 1500 is provided. Referring to part (b) of FIG. 15, a shallow trench isolation (STI) layer 1502, such as a silicon oxide layer, is deposited. Referring to part (c) of FIG. 15, trenches are formed in the STI layer 1502 to form patterned STI layer 1504. Referring to part (d) of FIG. 15, a silicon nitride layer is deposited and planarized to form plugs 1506 in the openings of the patterned STI layer 1504. Referring to part (e) of FIG. 15, select ones of the plugs 1506 are removed to open trenches for growing green and blue nanowires. Referring to part (f) of FIG. 15, green and blue LED structures are grown. In an example, one of the blue or green LEDs includes an n-GaN core 1510, an InGaN active layer 1512, and a p-GaN cladding layer 1514. The other of the blue or green LEDs includes an n-GaN core 1510', an InGaN active layer 1512', and a p-GaN cladding layer 1514'. Referring to part (g) of FIG. 15, a dielectric material 1516 is deposited and planarized. A trench 1518 is then made through the dielectric material 1516, and the remaining plugs 1506 are removed for red LED growth. Referring to part (h) of FIG. 15, a GaAs seed layer 1522 is formed on the exposed portion of the silicon (111) wafer 1500. Referring to part (i) of FIG. 15, a red nanowire LED structure is fabricated on the GaAs seed layer 1522. In an example, the red LED includes an n-AlInP core 1524, an AlInGaP active layer 1526, and a p-AlInP cladding layer 1524.

In accordance with one or more embodiments of the present disclosure a hybrid pixel involves the use of AlIn-GaP for red emission, InGaN (with indium at approximately 40%) for green emission, and InGaN (with indium at approximately 20%) for blue emission. The structure may provide for low cost as the above solution but with higher red power efficacy. It is to be appreciated that the power efficacy of red LEDs with size of approximately 200 μm×200 μm is approximately 100-150 lumens/Watt when AlInGaP/AlInP multi quantum wells are used to produce red emission. On the other hand, the performance of similarly sized red LEDs is approximately less than 10 lumens/Watt when InGaN/GaN multi quantum wells are used to produce red emission. Thus, in an embodiment, a 10× relative performance gain may be achieved using a hybrid material system for fabricating RGB micro LED pixels.

In an embodiment, upon fabrication of a micro-LED wafer, in order to fabricate a micro-LED based display, a transfer method is used in which micro-LEDs are transferred from a source wafer to a carrier wafer and then bonded with a target display backplane with the assistance of precise alignment, thermal compression bonding and selective release using a UV source as an ablation source to release select one of the LEDs.

In an exemplary approach for ultimately transferring micro LED pixels from a silicon wafer to a display backplane, FIGS. 16A-16F illustrate cross-sectional views of a method of transferring pixel elements or RGB chips from a silicon wafer to a display backplane, in accordance with an embodiment of the present disclosure. It is to be appreciated that, as contemplated for embodiments described herein, typically, a plurality of micro LEDs with different colors that have been grown on a single wafer monolithically is ultimately transferred to the display backplane. The scope is thus not limited to transferring "RGB chips". It is also to be appreciated that the below bonding approach may be performed in a bonder too such as tool 500 described above in association with FIG. 5.

Figure 16A:
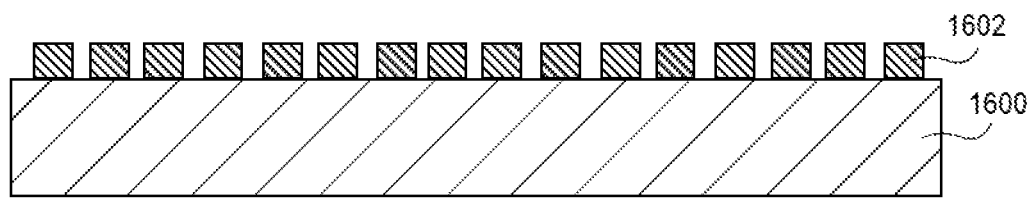
FIGS. 16A-16F illustrate cross-sectional views of a method of transferring pixel elements or RGB chips from a silicon wafer to a display backplane, in accordance with an embodiment of the present disclosure.
Figure 16B:
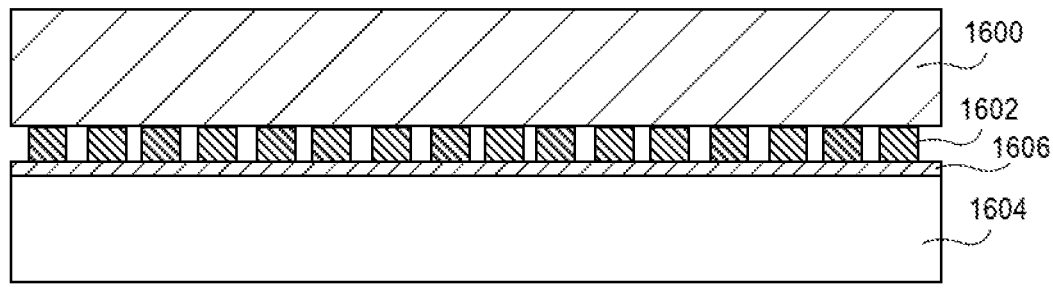
Figure 16C:
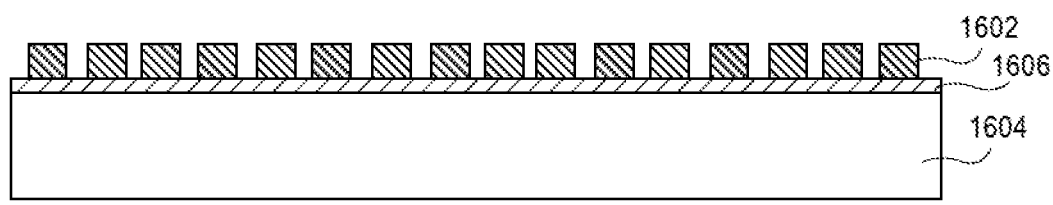

Referring to FIG. 16A, a silicon wafer 1600 having micro LED pixel elements 1602 thereon is provided. The silicon wafer 1600 is flipped and the LED pixel elements 1602 are attached to a temporary carrier 1604 having an adhesive layer 1606 thereon, as is depicted in FIG. 16B. In one embodiment, the temporary carrier 1604 is a glass substrate transparent or mostly transparent to UV light. Referring to FIG. 16C, the source silicon wafer 1600 is removed, e.g., by grinding, chemical mechanical polishing (CMP), dry etching and/or wet etching.

Figure 16D:
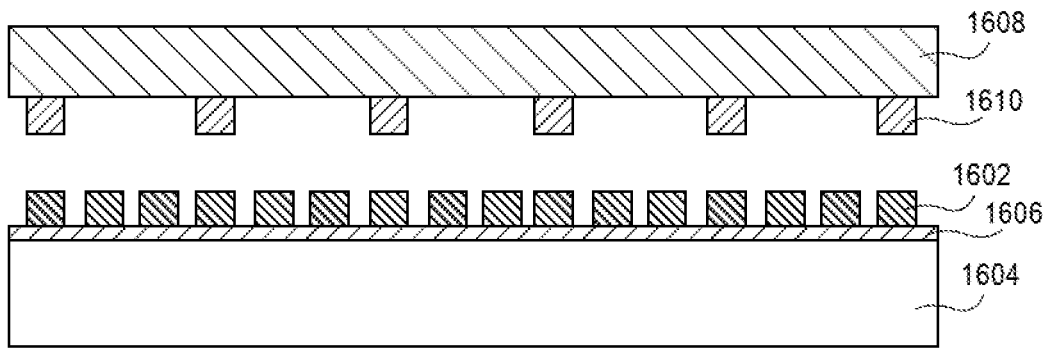
Figure 16E:
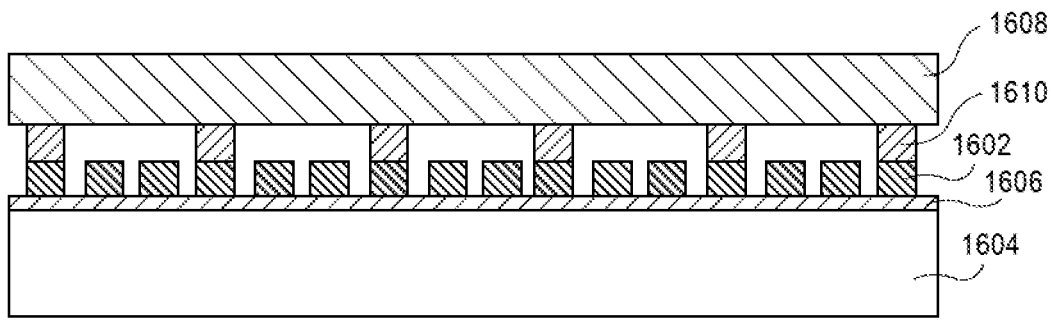
Figure 16F:
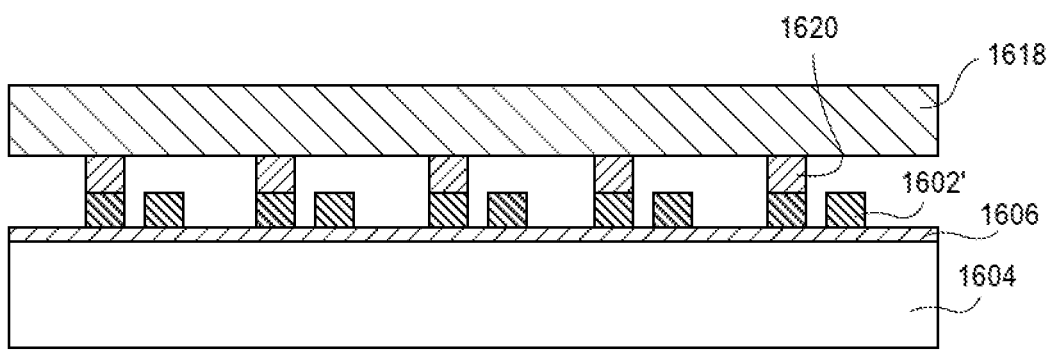

Referring to FIG. 16D, the LED pixel elements 1602 on the temporary carrier 1604 are aligned with metal bumps 1610 of a backplane 1608, such as a display thin film transistor (TFT) backplane. Thermal compression bonding is then performed for aligned micro LED pixel elements 1602 and metal bumps 1610, as is depicted in FIG. 16E. In one embodiment, the thermal compression bonding is performed at a temperature in the range of 25° C. to 430° C., and at a pressure in the range of 1-2 MPa. The bonded micro LED pixel elements 1602 are then detached from the temporary carrier 1604. In an embodiment, release of the bonded micro LED pixel elements 1602 is dependent on the properties of the adhesive layer 1606. In one such embodiment, UV irradiation directed through a glass temporary carrier 1604 is used to release the bonded micro LED pixel elements 1602, e.g., from a UV-curable adhesive layer.

In an embodiment, the display pitch (i.e., the pitch of the metal bumps 1610 of a backplane 1608) is an integer multiple of the pitch of the micro LED pixel elements 1602 on the temporary carrier 1604. In one such embodiment, referring to FIG. 16F, the remaining micro LED pixel elements 1602' are aligned with metal bumps 1620 of a new backplane 1618. The new backplane 1618 may be brought in close proximity of the temporary carrier 1604 but with a misalignment that is equivalent to the RGB chip pitch on the temporary carrier 1604 in order to pick new RGB chips from temporary carrier 1604 to new backplane 1618. The alignment may be performed using infrared imaging, optical, or mechanical approaches common to wafer-to-wafer bonders.

In another embodiment, a source wafer (e.g., silicon substrate on which LED pixels are formed) is aligned in close proximity to the target display substrate in a tool similar to the tool described above in association with FIG. 5 but with an IR source instead of the UV source. Thermocompression bonding (TCB) is then used to bond micro LEDs to metal pad bumps on the target substrate. After bonding of micro LED RGB chips from the silicon source wafer to a first target display substrate, micro LED RGB chips are detached (de-bonded) from the source wafer using infrared (IR) radiation through the silicon wafer. A second target display substrate is brought in close proximity of the silicon source wafer but with a misalignment that is exactly equivalent to the RGB chip pitch on the source wafer in order to pick new RGB chips from source wafer to second target display substrate. The alignment may be performed using infrared imaging, optical, or mechanical approaches common to wafer-to-wafer bonders.

Figure 17:
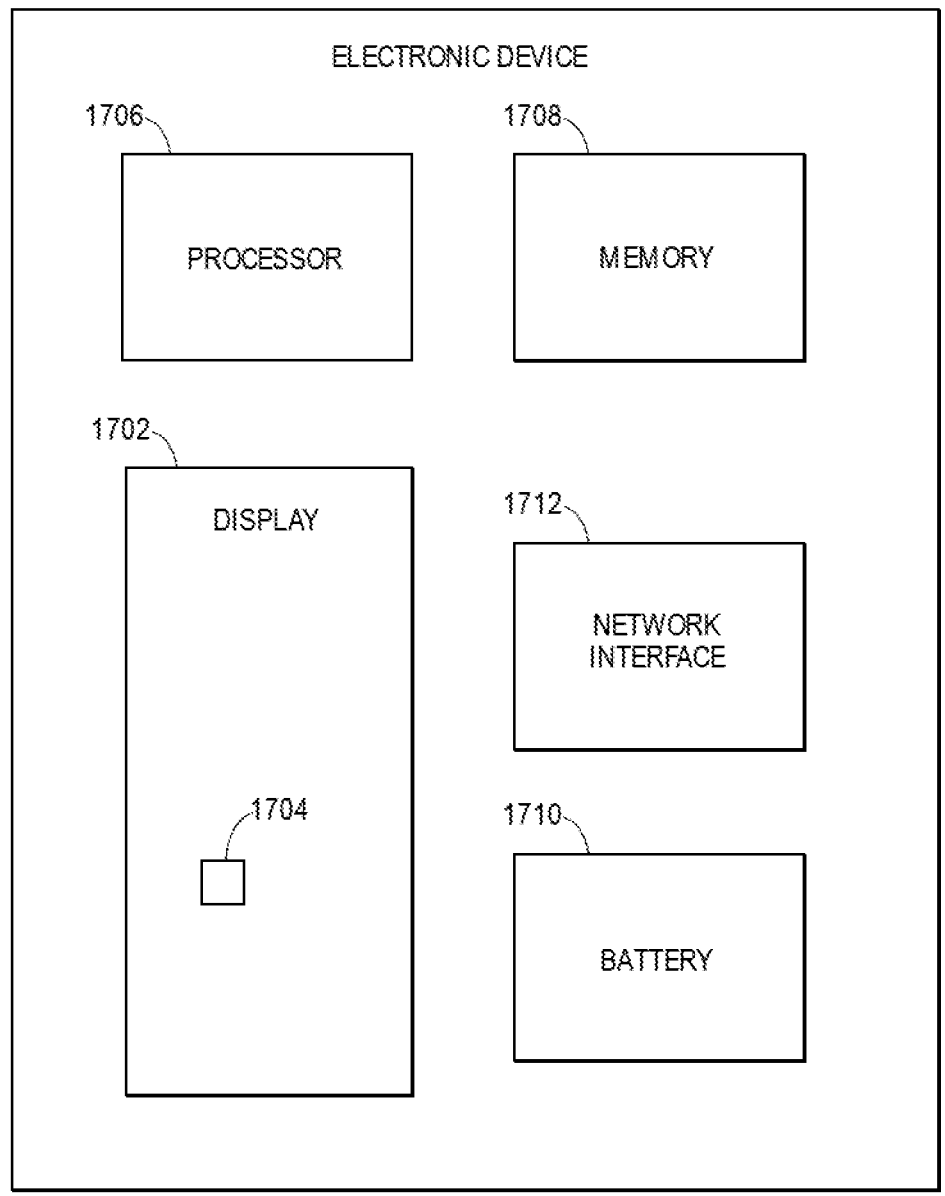
FIG. 17 is an electronic device having a display, in accordance with embodiments of the present disclosure.

FIG. 17 is an electronic device having a display, in accordance with embodiments of the present disclosure. Referring to FIG. 17, an electronic device 1700 has a display or display panel 1702 with a micro-structure 1704. The display may also have glass layers and other layers, circuitry, and so forth. The display panel 1702 may be a micro-LED display panel. As should be apparent, only one microstructure 1704 is depicted for clarity, though a display panel 1702 will have an array or arrays of microstructures including nanowire LEDs.

The electronic device 1700 may be a mobile device such as smartphone, tablet, notebook, smartwatch, and so forth. The electronic device 1700 may be a computing device, stand-alone display, television, display monitor, vehicle computer display, the like. Indeed, the electronic device 1700 may generally be any electronic device having a display or display panel.

The electronic device 1700 may include a processor 1706 (e.g., a central processing unit or CPU) and memory 1708. The memory 1708 may include volatile memory and non-volatile memory. The processor 1706 or other controller, along with executable code store in the memory 1708, may provide for touchscreen control of the display and well as for other features and actions of the electronic device 1700.

In addition, the electronic device 1700 may include a battery 1710 that powers the electronic device including the display panel 1702. The device 1700 may also include a network interface 1712 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1700 may include additional components including circuitry and other components.

Thus, embodiments described herein include micro light-emitting diode (LED) displays, and fabrication and assembly of micro LED displays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A method of manufacturing a micro-light emitting diode (LED) display panel includes positioning a glass carrier substrate above a display backplane substrate, the glass carrier substrate having a plurality of light-emitting diode (LED) pixel elements attached to an adhesive layer thereon, and the display backplane substrate having a plurality of metal bumps thereon. The method also includes aligning the glass carrier substrate with the display backplane substrate. The method also includes moving the display backplane substrate and the glass carrier substrate together to couple at least a portion of the plurality of LED pixel elements to corresponding ones of the plurality of metal bumps. The method also includes irradiating the adhesive layer through the glass carrier substrate with a UV light source to release and transfer the portion of the plurality of LED pixel elements to the corresponding ones of the plurality of metal bumps. The method also includes, subsequently, separating the glass carrier substrate from the display backplane substrate.

Example Embodiment 2

The method of example embodiment 1, wherein the plurality of metal bumps on the display backplane substrate has a pitch that is an integer multiple of a pitch of the plurality of LED pixel elements on the glass carrier substrate.

Example Embodiment 3

The method of example embodiment 1 or 2, wherein the at least the portion of the plurality of LED pixel elements is a less than all of the plurality of LED pixel elements, the method further including positioning and aligning the glass carrier substrate above a second display backplane substrate, the glass carrier substrate having a remainder of the plurality of light-emitting diode (LED) pixel elements thereon, the aligning including moving one of the glass carrier substrate and the second display backplane substrate horizontally by a distance equal to an integer multiple of a pitch of the plurality of LED pixel elements on the glass carrier substrate, and transferring and bonding at least a portion of the remainder of the plurality of LED pixel elements to corresponding ones of a plurality of metal bumps of the second display backplane substrate.

Example Embodiment 4

The method of example embodiment 3, wherein the at least the portion of the remainder of the plurality of LED pixel elements is a less than all of the remainder of the plurality of LED pixel elements, the method further including positioning and aligning the glass carrier substrate above a third display backplane substrate, the glass carrier substrate having a second remainder of the plurality of light-emitting diode (LED) pixel elements thereon, the aligning including moving one of the glass carrier substrate and the second display backplane substrate horizontally by a distance equal to an integer multiple of a pitch of the plurality of LED pixel elements on the glass carrier substrate, and transferring and bonding at least a portion of the second remainder of the plurality of LED pixel elements to corresponding ones of a plurality of metal bumps of the third display backplane substrate.

Example Embodiment 5

The method of example embodiment 1, 2, 3 or 4, wherein the plurality of LED pixel elements is a plurality of nanowire-based LED pixel elements.

Example Embodiment 6

The method of example embodiment 5, wherein at least a portion of the plurality of nanowire-based LED pixel elements includes GaN nanowires.

Example Embodiment 7

A pixel element for a micro-light emitting diode (LED) display panel includes a blue color nanowire LED above a first nucleation layer above a substrate, the blue color nanowire LED including a first GaN core. A green color nanowire LED is above a second nucleation layer above the substrate, the green color nanowire LED including a second GaN core. A red color nanowire LED is above a third nucleation layer above the substrate, the red color nanowire LED including a GaInP core.

Example Embodiment 8

The pixel element of example embodiment 7, wherein the blue color nanowire further includes a first InGaN active layer on the first GaN core, the green color nanowire further includes a second InGaN active layer on the second GaN core, and the red color nanowire further includes an AlInGaP active layer on the GaInP core.

Example Embodiment 9

The pixel element of example embodiment 8, wherein the first InGaN active layer includes less In than the second InGaN active layer.

Example Embodiment 10

The pixel element of example embodiment 8 or 9, wherein the blue color nanowire further includes a first p-type GaN cladding layer on the first InGaN active layer, the green color nanowire further includes a second p-type GaN cladding layer on the second InGaN active layer, and the red color nanowire further includes a p-type GaInP cladding layer on the AlInGaP active layer.

Example Embodiment 11

The pixel element of example embodiment 7, 8, 9 or 10, wherein the first and second nucleation layers include TiN and AlN, and the third nucleation layer includes GaAs.

Example Embodiment 12

A method of fabricating a pixel element for a micro-light emitting diode (LED) display panel includes forming a blue color nanowire LED on a first nucleation layer above a silicon (111) substrate, the blue color nanowire LED including a first GaN core. The method further includes forming a green color nanowire LED above a second nucleation layer above the silicon (111) substrate, the green color nanowire LED including a second GaN core. The method further includes forming a red color nanowire LED above a third nucleation layer above the silicon (111) substrate, the red color nanowire LED including a GaInP core.

Example Embodiment 13

The method of example embodiment 12, wherein the blue color nanowire further includes a first InGaN active layer on the first GaN core, the green color nanowire further includes a second InGaN active layer on the second GaN core, and the red color nanowire further includes an AlInGaP active layer on the GaInP core.

Example Embodiment 14

The method of example embodiment 13, wherein the first InGaN active layer includes less In than the second InGaN active layer.

Example Embodiment 15

The method of example embodiment 13 or 14, wherein the blue color nanowire further includes a first p-type GaN cladding layer on the first InGaN active layer, the green color nanowire further includes a second p-type GaN cladding layer on the second InGaN active layer, and the red color nanowire further includes a p-type GaInP cladding layer on the AlInGaP active layer.

Example Embodiment 16

The method of example embodiment 13, 14 or 15, wherein the first and second nucleation layers comprise a layer of TiN, Zr or HfN, and a layer of AlN, and the third nucleation layer comprises GaAs.

Example Embodiment 17

A method of fabricating a pixel element for a micro-light emitting diode (LED) display panel includes forming a first nucleation layer above a silicon (111) substrate, forming a GaN core on the first nucleation layer, forming a second nucleation layer above the silicon (111) substrate, and forming a GaInP core on the second nucleation layer.

Example Embodiment 18

The method of example embodiment 17, further including forming an InGaN active layer on the GaN core, and forming an AlInGaP active layer on the GaInP core.

Example Embodiment 19

The method of example embodiment 18, further including forming a p-type GaN cladding layer on the InGaN active layer, and forming a p-type GaInP cladding layer on the AlInGaP active layer.

Example Embodiment 20

The method of example embodiment 17, 18 or 19, wherein the first nucleation layer includes TiN and AlN, and the second nucleation layer includes GaAs.

What is claimed is:

1. A method of manufacturing a micro-light emitting diode (LED) display panel, the method comprising:
    positioning a glass carrier substrate above a display backplane substrate, the glass carrier substrate having a plurality of light-emitting diode (LED) pixel elements attached to an adhesive layer thereon, and the display backplane substrate having a plurality of metal bumps thereon, each of the LED pixel elements comprising a blue color nanowire LED on a first nucleation layer above a silicon (111) substrate, the blue color nanowire LED comprising a first GaN core, a green color nanowire LED above a second nucleation layer above the silicon (111) substrate, the green color nanowire LED comprising a second GaN core, and a red color nanowire LED above a third nucleation layer above the silicon (111) substrate, the red color nanowire LED comprising a GaInP core;
    aligning the glass carrier substrate with the display backplane substrate;
    moving the display backplane substrate and the glass carrier substrate together to couple at least a portion of the plurality of LED pixel elements to corresponding ones of the plurality of metal bumps, wherein moving the display backplane substrate and the glass carrier substrate together comprises moving the display backplane substrate from a first position to a second position while the glass carrier substrate remains in a fixed position, the second position different than the first position;
    irradiating the adhesive layer through the glass carrier substrate with a UV light source to release and transfer the portion of the plurality of LED pixel elements to the corresponding ones of the plurality of metal bumps; and, subsequently,
    separating the glass carrier substrate from the display backplane substrate.

2. The method of claim 1, wherein the plurality of metal bumps on the display backplane substrate has a pitch that is an integer multiple of a pitch of the plurality of LED pixel elements on the glass carrier substrate.

3. The method of claim 1, wherein the at least the portion of the plurality of LED pixel elements is a less than all of the plurality of LED pixel elements, the method further comprising:
    positioning and aligning the glass carrier substrate above a second display backplane substrate, the glass carrier substrate having a remainder of the plurality of light-emitting diode (LED) pixel elements thereon, the aligning comprising moving one of the glass carrier substrate and the second display backplane substrate horizontally by a distance equal to an integer multiple of a pitch of the plurality of LED pixel elements on the glass carrier substrate; and
    transferring and bonding at least a portion of the remainder of the plurality of LED pixel elements to corresponding ones of a plurality of metal bumps of the second display backplane substrate.

4. The method of claim 3, wherein the at least the portion of the remainder of the plurality of LED pixel elements is a less than all of the remainder of the plurality of LED pixel elements, the method further comprising:
    positioning and aligning the glass carrier substrate above a third display backplane substrate, the glass carrier substrate having a second remainder of the plurality of light-emitting diode (LED) pixel elements thereon, the aligning comprising moving one of the glass carrier substrate and the second display backplane substrate horizontally by a distance equal to an integer multiple of a pitch of the plurality of LED pixel elements on the glass carrier substrate; and
    transferring and bonding at least a portion of the second remainder of the plurality of LED pixel elements to corresponding ones of a plurality of metal bumps of the third display backplane substrate.

5. The method of claim 1, wherein the plurality of LED pixel elements is a plurality of nanowire-based LED pixel elements.

6. The method of claim 5, wherein at least a portion of the plurality of nanowire-based LED pixel elements comprises GaN nanowires.

7. A method of fabricating a pixel element for a micro-light emitting diode (LED) display panel, the method comprising:
    forming a blue color nanowire LED on a first nucleation layer above a silicon (111) substrate, the blue color nanowire LED comprising a first GaN core;
    forming a green color nanowire LED above a second nucleation layer above the silicon (111) substrate, the green color nanowire LED comprising a second GaN core; and
    forming a red color nanowire LED above a third nucleation layer above the silicon (111) substrate, the red color nanowire LED comprising a GaInP core.

8. The method of claim 7, wherein the blue color nanowire further comprises a first InGaN active layer on the first GaN core, the green color nanowire further comprises a second InGaN active layer on the second GaN core, and the red color nanowire further comprises an AlInGaP active layer on the GaInP core.

9. The pixel element of claim 8, wherein the first InGaN active layer comprises a total atomic percent of In, and the second InGaN active layer comprises a total atomic percent of In, and wherein the total atomic percent of In of the first InGaN active layer is less In than the total atomic percent of In of the second InGaN active layer.

10. The method of claim 8, wherein the blue color nanowire further comprises a first p-type GaN cladding layer on the first InGaN active layer, the green color nanowire further comprises a second p-type GaN cladding layer on the second InGaN active layer, and the red color nanowire further comprises a p-type GaInP cladding layer on the AlInGaP active layer.

11. The method of claim 7, wherein the first and second nucleation layers comprise a layer of TiN, Zr or HfN, and a layer of AlN, and the third nucleation layer comprises GaAs.

12. A method of fabricating a pixel element for a micro-light emitting diode (LED) display panel, the method comprising:
    forming a first nucleation layer above a silicon (111) substrate;
    forming a GaN core on the first nucleation layer;
    forming a second nucleation layer above the silicon (111) substrate; and
    forming a GaInP core on the second nucleation layer.

13. The method of claim 12, further comprising forming an InGaN active layer on the GaN core, and forming an AlInGaP active layer on the GaInP core.

14. The method of claim 13, further comprising forming a p-type GaN cladding layer on the InGaN active layer, and forming a p-type GaInP cladding layer on the AlInGaP active layer.

15. The method of claim 12, wherein the first nucleation layer comprises TiN and AlN, and the second nucleation layer comprises GaAs.

\* \* \* \* \*